United States Patent
Sumant et al.

(10) Patent No.: US 9,875,894 B2
(45) Date of Patent: *Jan. 23, 2018

(54) GRAPHENE LAYER FORMATION AT LOW SUBSTRATE TEMPERATURE ON A METAL AND CARBON BASED SUBSTRATE

(71) Applicant: UChicago Argonne, LLC, Chicago, IL (US)

(72) Inventors: Anirudha V. Sumant, Plainfield, IL (US); Diana Berman, Darien, IL (US)

(73) Assignee: UChicago Argonne, LLC, Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/563,201

(22) Filed: Dec. 8, 2014

(65) Prior Publication Data
US 2015/0206748 A1 Jul. 23, 2015

Related U.S. Application Data

(63) Continuation-in-part of application No. 13/481,110, filed on May 25, 2012, now Pat. No. 8,906,772, which is a continuation-in-part of application No. 13/448,068, filed on Apr. 16, 2012, now Pat. No. 8,652,946.

(51) Int. Cl.
*H01L 21/02* (2006.01)
*B82Y 40/00* (2011.01)

(52) U.S. Cl.
CPC .... *H01L 21/02376* (2013.01); *H01L 21/0262* (2013.01); *H01L 21/02381* (2013.01); *H01L 21/02444* (2013.01); *H01L 21/02527* (2013.01); *H01L 21/02612* (2013.01); *B82Y 40/00* (2013.01); *H01L 21/02488* (2013.01); *H01L 21/02491* (2013.01)

(58) Field of Classification Search
CPC ......... H01L 21/02376; H01L 21/02612; H01L 21/0262; H01L 21/02527; H01L 21/02381; H01L 21/02444; H01L 21/02491; H01L 21/02488; B82Y 40/00
See application file for complete search history.

(56) References Cited

U.S. PATENT DOCUMENTS

| | | | |
|---|---|---|---|
| 7,015,142 B2 | 3/2006 | Deheer et al. | |
| 7,781,061 B2 | 8/2010 | Garcia et al. | |
| 8,647,894 B2 | 2/2014 | Niyogi et al. | |
| 8,652,946 B2 * | 2/2014 | Sumant | H01L 21/02376 257/E21.27 |
| 8,906,772 B2 * | 12/2014 | Sumant | H01L 21/02376 257/E21.007 |
| 2009/0047520 A1 | 2/2009 | Lee et al. | |
| 2010/0218801 A1 | 9/2010 | Sung et al. | |

(Continued)

OTHER PUBLICATIONS

Notice of Allowance for U.S. Appl. No. 14/167,477, dated Jul. 22, 2015, 9 pages.

(Continued)

*Primary Examiner* — Latanya N Crawford
(74) *Attorney, Agent, or Firm* — Foley & Lardner LLP

(57) ABSTRACT

A system and method for forming graphene layers on a substrate. The system and methods include direct growth of graphene on diamond and low temperature growth of graphene using a solid carbon source.

10 Claims, 27 Drawing Sheets

(56) References Cited

U.S. PATENT DOCUMENTS

| | | | |
|---|---|---|---|
| 2011/0024767 A1* | 2/2011 | Sung | H01L 21/568 257/77 |
| 2011/0048625 A1 | 3/2011 | Caldwell et al. | |
| 2011/0206934 A1 | 8/2011 | Bol et al. | |
| 2012/0141799 A1 | 6/2012 | Kub et al. | |
| 2012/0161106 A1 | 6/2012 | Kim et al. | |
| 2012/0181501 A1* | 7/2012 | Sung | C01B 31/0446 257/9 |
| 2013/0089982 A1 | 4/2013 | Wei et al. | |
| 2013/0116114 A1 | 5/2013 | Nguyen | |
| 2013/0272951 A1* | 10/2013 | Hiura | H01L 21/0237 423/448 |
| 2013/0273723 A1 | 10/2013 | Sumant | |
| 2013/0293100 A1* | 11/2013 | Moody | H01J 1/34 313/542 |
| 2014/0054505 A1* | 2/2014 | Tse | B22F 9/30 252/373 |
| 2014/0079623 A1* | 3/2014 | Jeon | C01B 31/0453 423/448 |
| 2014/0120270 A1 | 5/2014 | Tour et al. | |
| 2014/0147994 A1* | 5/2014 | Sumant | H01L 21/02376 438/478 |
| 2014/0205763 A1 | 7/2014 | Lu et al. | |
| 2014/0234200 A1 | 8/2014 | Tour et al. | |
| 2014/0261998 A1* | 9/2014 | Veerasamy | B82Y 30/00 156/247 |
| 2014/0308523 A1* | 10/2014 | Veerasamy | B82Y 30/00 428/408 |
| 2014/0370295 A1* | 12/2014 | Choi | C01B 31/0446 428/408 |
| 2015/0206748 A1 | 7/2015 | Sumant et al. | |

OTHER PUBLICATIONS

Freitag, et al., "Energy Dissipation in Graphene Field-Effect Transistors", Nano Letters, Mar. 30, 2009, pp. 1883-1888, vol. 9, No. 5, American Chemical Society, USA.

Grierson et al., "Thermal Stability and Rehybridization of Carbon Bonding in Tetrahedral Amorphous Carbon", Journal of Applied Physics, (2010), 7 pages, American Institute of Physics.

Kim et al., "Low-temperature synthesis of large-area graphene-based transparent conductive films using surface wave plasma chemical vapor deposition", Applied Physics Letters, (2011), pp. 091502, vol. 98, American Institute of Physics.

Lee et al., "Breakdown Current Density of CVD-Grown Multilayer Graphene Interconnects", IEEE Electron Device Letters, Apr. 2011, pp. 557-559, IEEE.

Li et al., "Synthesis, Characterization, and Properties of Large-Area Graphene Films", ECS Transactions, (2009) 19(5) pp. 41-52, The Electrochemical Society.

Lin et al., "100-ghZ Transistors from Wafer-Scale Epitaxial Graphene", Brevia, Feb. 5, 2010, p. 662, vol. 327, Science, 222. sciencemag.org.

Non-Final Office Action on U.S. Appl. No. 13/448,068 dated Mar. 14, 2013, 6 pages.

Non-Final Office Action on U.S. Appl. No. 14/167,477 dated Mar. 24, 2015, 10 pages.

Non-Final Office Action on U.S. Appl. No. 13/481,110 dated Nov. 1, 2013, 9 pages.

Notice of Allowance for U.S. Appl. No. 13/481,110 dated Aug. 8, 2014, 7 pages.

Notice of Allowance on U.S. Appl. No. 13/448,068 dated Oct. 7, 2013, 13 pages.

Notice of Allowance on U.S. Appl. No. 13/481,110 dated Mar. 7, 2014, 7 pages.

Office Action for U.S. Appl. No. 14/167,477, dated Mar. 28, 2014, 11 pages.

Schwierz, Frank, "Industry-compatible graphene transistors", Nature, Apr. 7, 2011, vol. 472, pp. 41-42, Macmillan Publishers Limited.

Weatherup et al., "In Situ Characterization of Allow Catalysts for Low-Temperature Graphene Growth", Nano Letters, (2011), pp. 4154-4160, vol. 11, ACS Publications, American Chemical Society.

Yu et al., "Bilayer Graphene System: Current-Induced Reliability Limit", IEEE Electron Device Letters, Oct. 2010, pp. 1155-1157, IEEE.

Yu et al., "Graphene-on-Diamond Devices with Increased Current-Carrying Capacity: Carbon sp2-on-sp2 Technology", Nano Letters, (2012), pp. A-F, American Chemical Society.

International Search Report and Written Opinion for Application No. PCT/US2015/064330, Feb. 12, 2016, 15 pages.

Mun et al., Local Growth of Graphene by Ion Implementation of Carbon in a Nickel Thin Film followed by Rapid Thermal Annealing, Journal of the Electrchemical Society, 159 (6) G89-G92, Apr. 30, 2012, 4 pages.

Weatherup, et al., Introducing Carbon Diffusion Barriers for Uniform, High-Quality Graphene Growth from Solid Sources, NANO Letters 2013, 13, 4624-4631, Sep. 11, 2013, 8 pages.

* cited by examiner

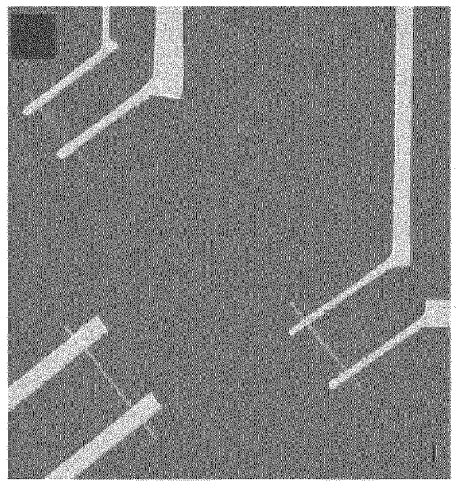
FIG. 3A(1)
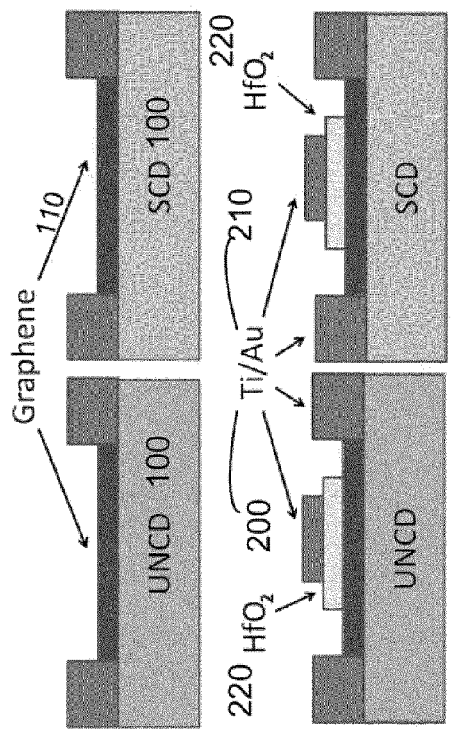
FIG. 3A(2)
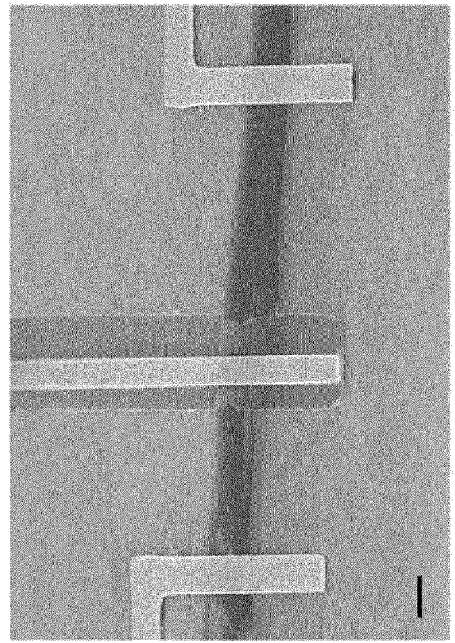
FIG. 3B
FIG. 3C
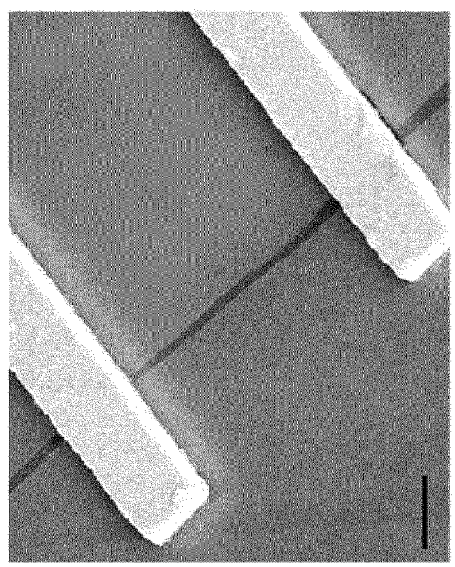
FIG. 3D

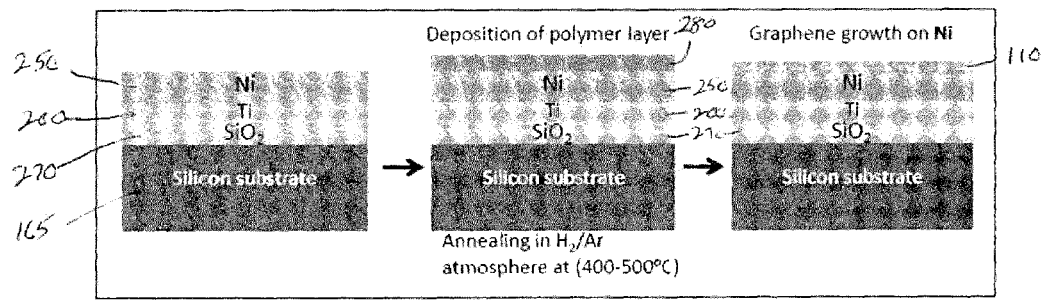
FIG. 13A    FIG. 13B    FIG. 13C
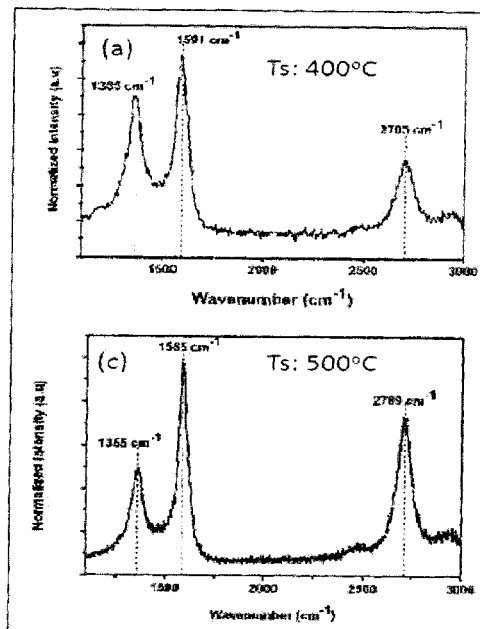
FIG. 14A
FIG. 14C
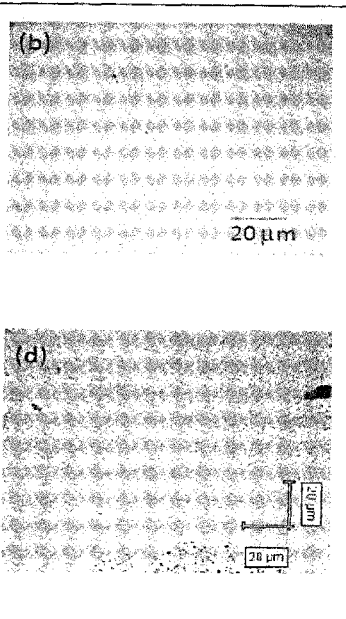
FIG. 14B
FIG. 14D

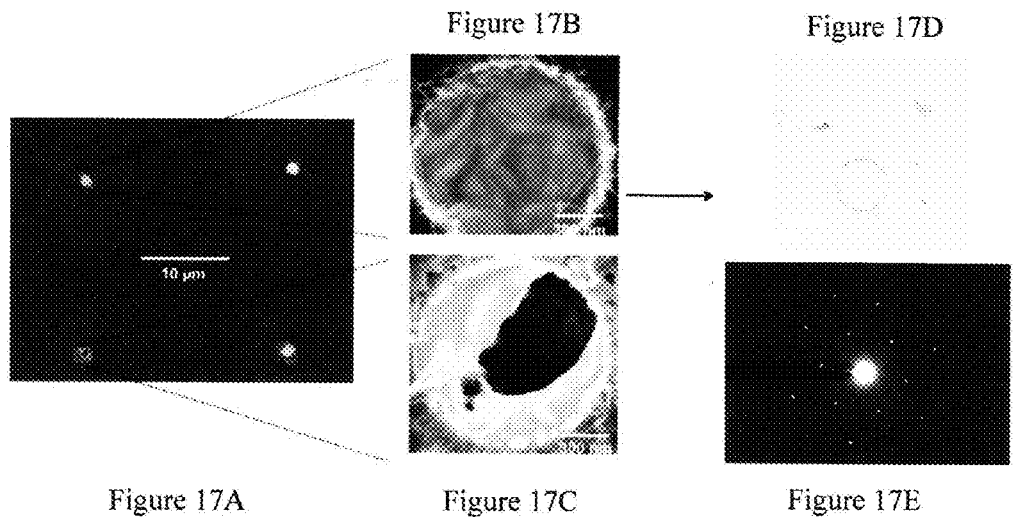
Figure 17B  Figure 17D
Figure 17A  Figure 17C  Figure 17E
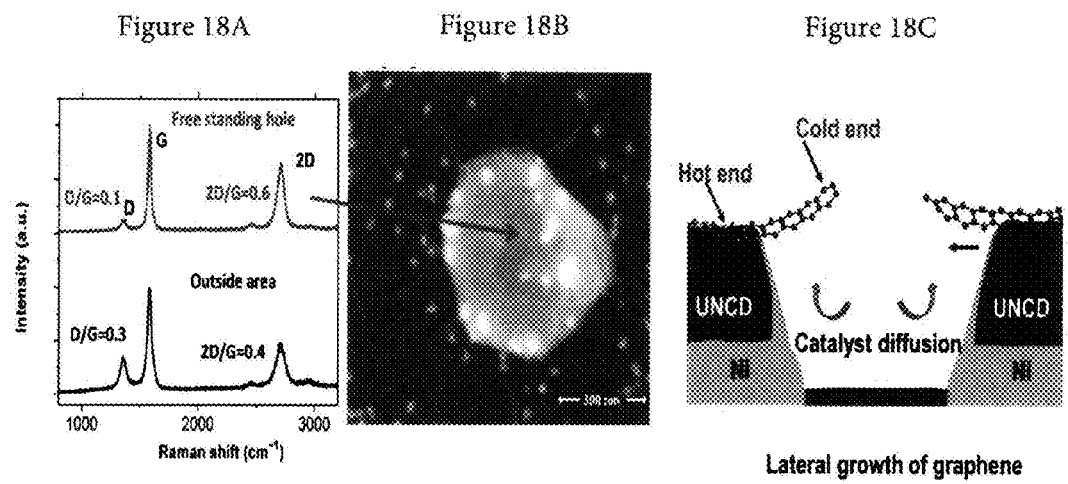
Figure 18A  Figure 18B  Figure 18C

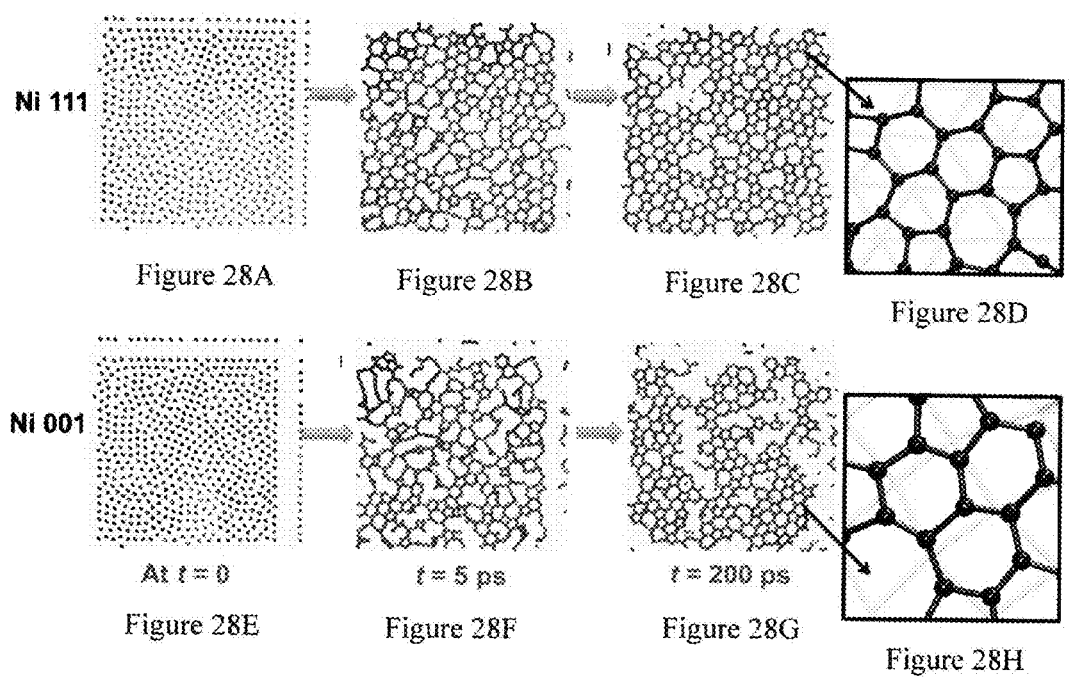
Figure 28A    Figure 28B    Figure 28C    Figure 28D
At t = 0    t = 5 ps    t = 200 ps
Figure 28E    Figure 28F    Figure 28G    Figure 28H
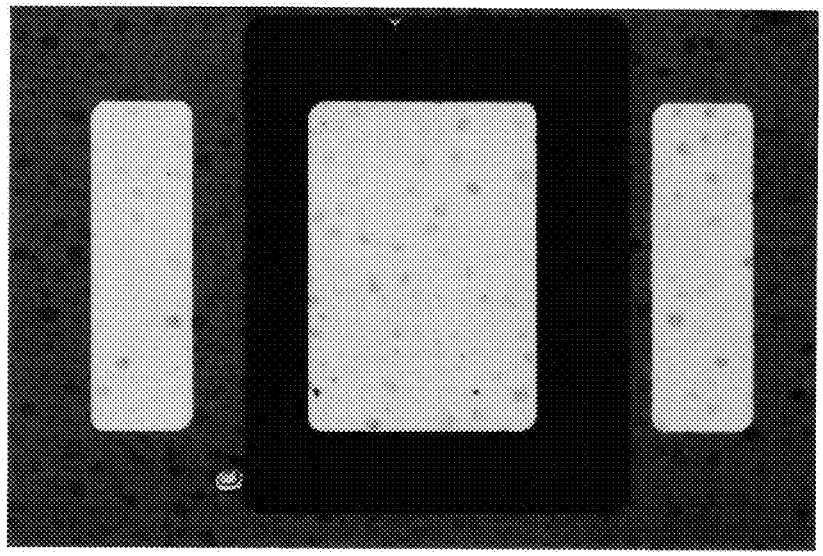
Figure 29

GRAPHENE LAYER FORMATION AT LOW SUBSTRATE TEMPERATURE ON A METAL AND CARBON BASED SUBSTRATE

CROSS REFERENCE TO RELATED APPLICATIONS

This application is a Continuation-In-Part of U.S. patent application Ser. No. 13/481,110 filed May 25, 2012 and U.S. patent application Ser. No. 13/448,068, filed Apr. 16, 2012, U.S. Pat. No. 8652946, both of which are incorporated herein by reference.

STATEMENT OF GOVERNMENT INTEREST

The U.S. Government claims certain rights in this invention pursuant to Contract No. W-31-109-ENG-38 between the United States Government and the University of Chicago and/or pursuant to DE-AC02-06CH11357 between the United States Government and UChicago Argonne, LLC representing Argonne National Laboratory.

FIELD OF THE INVENTION

The invention relates generally to methods and systems for forming graphene layers on a carbon based substrate. More particularly this invention relates to methods and systems for growth of graphene, including direct growth of graphene on diamond and low temperature growth of graphene using a solid carbon source.

BACKGROUND OF THE INVENTION

Since the discovery of graphene and realization of its exceptional electronic properties in suspended form, there have been many efforts in fabricating FET-type devices based on single and bilayer graphene on a $SiO_2$ substrate. However, performance of these devices is found to be inferior to the expected intrinsic properties of graphene. It has been observed that apart from carrier mobility in graphene, which is sensitive to trapped charges, and surface impurities at the graphene-oxide interlace, breakdown current density in graphene depends sensitively on the heat dissipation property of the underlying supporting substrate. Although graphene has extremely high intrinsic thermal conductivity, it is reported that in graphene devices that more than 70% of the heat dissipates through the 300 nm $SiO_2$ on silicon directly below the active graphene channel. The remainder of the heat is carried to the graphene that extends beyond the device and metallic contacts. Such a distribution of heat into the substrate cause undesirable effects on the overall performance of a device, such as the thermally generated carriers affecting the electronic mobility parameters of a device fabricated on top of the substrate.

The breakdown current density measurements of multilayer and few layer graphene disposed on a $SiO_2/Si$ substrate have been reported to be in the range of $7 \times 10^7$ to $10^8$ $A/cm^2$. The main breakdown mechanism of graphene is mostly due to the Joule heating, which sensitively depends upon the thermal conductivity and surface roughness of the underlying substrate. The thermal conductivity of $SiO_2$ $K=0.5-1.4$ W/mK at RT is more than two orders-of-magnitude smaller than that of Si, $K=145$ W/mK, which suggests that the use of a better heat-conducting material, directly below graphene, can improve graphene's JBR. Recently, it was demonstrated that replacement of $SiO_2$ with diamond-like carbon (DLC) helps to substantially improve the RF characteristics of the scaled graphene transistors. However, DLC is an amorphous material with $K=0.2-3.5$ W/mK at room temperature (hereinafter "RT"), which is a very low value and is close to that in $SiO_2$. Additionally, depending on the hydrogen content, the as deposited DLC films has high internal stress, which needs to be released by having to perform a separate step of annealing these films at higher temperatures (about 600° C.). These negative attributes provide a very strong motivation for the search for other materials which can be used as substrates for graphene based devices.

SUMMARY OF THE INVENTION

In one embodiment conventional $SiO_2$ substrates are replaced with diamond, such as synthetic single crystal diamond ("SCD") hereinafter and a graphene layer. The problem of prior art systems concerning heat dissipation is substantially reduced, leading to an order of magnitude increase in breakdown current density ("JPR" hereinafter) reaching up to one thousand times improvement over conventional metal based interconnects in FET-type devices and other electronic device applications like RF transistors. In other embodiments the substrate can be ultranano crystalline diamond ("UNCD" hereinafter) with grain size diameters of about 5-10 nm, resulting in improving JPR about 50% as compared to graphene on $SiO_2$ as a result of the increased thermal conductivity of the UNCD at elevated temperatures, close to the thermally-induced breakdown point.

In yet another embodiment a method and system provides direct growth of graphene layers on diamond, thereby eliminating various transfer processes previously required. In this process the diamond substrate can be single crystal or polycrystalline diamond.

In a further embodiment a method and system are provided for low temperature growth of graphene by using a solid carbon source and preferably using a Ni surface as the substrate, thereby allowing single or multilayer graphene in a controlled manner. In addition, the Ni (or other like performing transition metal or alloy) as the substrate is deposited on an adhesion layer, such as Ti, or other well-known compatible adhesion layer material. The adhesion layer can then be deposited on a substrate compatible with the adhesion layer. Such a substrate can be Si, $SiO_2$, combination thereof, or other conventional and compatible substrates to enable forming graphene by annealing a deposited polymer layer on the Ni or transition metal or metal alloy layer. Further, the polymer used to form the graphene can be a mixture of aliphatic hydrocarbon an alkene hydrocarbon.

In yet another embodiment, a method relates to forming graphene by providing a carbon precursor, forming a transition metal layer on the carbon precursor, and dissolving the transition metal layer into the carbon precursor by an annealing step at a temperature above 350 C. Then, the substrate is cooled below 1000 C thereby forming a graphene layer on the carbon precursor in less than one minute.

Yet another embodiment relates to a method of forming graphene on a substrate. A single crystal diamond substrate is provided. A transition metal layer is formed on the diamond substrate. The transition metal layer is dissolved into the diamond substrate by an annealing step. The substrate is cooled to room temperature, thereby forming a graphene layer.

Yet another embodiments relates to a method of forming graphene on a substrate. A diamond substrate is provided. A transition metal layer is formed on the diamond substrate. The transition metal layer is dissolved into the diamond substrate by an annealing step. The substrate is cooled thereby forming a graphene layer from the diamond substrate as a carbon precursor.

Yet another embodiment comprises providing a carbon precursor. A transition metal layer is formed on the carbon precursor. The transition metal layer is dissolved into the carbon precursor by an annealing step at a temperature above 350 C. The substrate is cooled to below 1000 C, thereby forming a graphene layer in less than one minute.

Yet another embodiment relates to a method of forming single domain graphene on a substrate. A diamond substrate is provided. A transition metal layer is formed on the diamond substrate. At least one hole is formed in the transition metal layer and diamond substrate. The transition metal layer is dissolved into the diamond substrate by an annealing step. The substrate is cooled. Single domain graphene is formed suspended over the at least one hole.

Yet another embodiment relates to a method of forming graphene on a substrate comprising providing a diamond substrate. A transition metal layer is formed on the diamond substrate. The transition metal layer is dissolved into the diamond substrate by an annealing step. The substrate is cooled, thereby forming a graphene layer from the diamond substrate as a carbon precursor.

Yet another embodiment relates to a method of forming patterned graphene on a substrate comprising providing a diamond substrate. A transition metal is patterned on the diamond substrate. The transition metal is dissolved into the diamond substrate by an annealing step. The substrate is cooled, thereby selectively forming graphene exhibiting a graphene pattern corresponding to the patterned transition metal.

These and other advantages and features of the invention, together with the organization and manner of operation thereof, will become apparent from the following detailed description when taken in conjunction with the accompanying drawings.

BRIEF DESCRIPTION OF THE DRAWINGS

FIG. 3A(1) illustrates a schematic of a two terminal device and FIG. 3A(2) a three terminal device fabricated for testing an UNCD/Si and a SCD substrate; FIG. 3B illustrates an optical microscopy image of the two terminal graphene processing device/prototype interconnect on a single crystal diamond; FIG. 3C illustrates an SEM image of the two terminal graphene for producing an UNCD/Si device;' and FIG. 3D illustrates a three terminal graphene for producing an UNCD/Si device.

FIG. 13A illustrates a schematic diagram of a first process step to synthesize graphene on Ni at low temperature with a solid precursor; FIG. 13B illustrates a second process step of depositing a polymer layer in synthesizing graphene on Ni; and FIG. 13C illustrates a third process step of graphene growth on Ni in synthesizing graphene on Ni.

FIG. 14A illustrates Raman spectra of graphene grown at 400° C.; FIG. 14B shows an optical micrograph of a Ni surface supporting the graphene of FIG. 14A; FIG. 14C shows Raman spectra of graphene grown at 500° C. on Ni; and FIG. 14D shows an optical micrograph of the Ni surface supporting the graphene of FIG. 14C.

FIG. 15A the Raman signature of graphene is demonstrated at different points of UNCD wafer covered with graphene; Figure B XPS analysis demonstrates clear carbon C is signature, indicating no nickel remained on the surface and no oxygen originated defects.

FIG. 16B Raman signature of graphene films produces at different temperatures indicates the variation in the number of grown layers (single layer grown at 800° C. and multilayer grown at 1000° C.). The Raman spectra of single layer graphene grown on copper and then transferred on the UNCD film are provided for reference.

FIGS. 17A-E show lateral growth of single domain free-standing graphene on diamond: FIG. 17A Successful growth of graphene on 4 holes is presented; FIG. 17B full coverage of the hole is demonstrated; FIG. 17C Graphene partially grown on the hole confirms free-standing nature; FIG. 17D TEM image confirms a single-domain graphene growth with FIG. 17E SAED pattern indicating diffraction of single-crystal film.

FIG. 18A Changes in the intensities of D and 2D peaks for Raman signature of the graphene on the hole indicate growth of the free-standing graphene; FIG. 18B. The Raman signature of graphene grown directly on UNCD (outside area) is provided for the reference; FIG. 18C The schematic of mechanism of free-standing graphene growth is presented.

FIG. 19A-F show schematic of the Ni(111) facilitated graphene growth is presented in FIGS. 19A-D with two mechanisms outlined by molecular dynamic (MD) simulations: FIG. 19E Carbon diffusion through the nickel film and eventual segregation of nickel through diamond grain boundaries, and FIG. 19F growth of uniform graphene film on Ni (111) surface. Carbon is presented by dark grey color, while nickel by orange.

FIG. 21A indicates schematics and SEM cross-section of the initial layer-by-layer film configuration, FIG. 21B demonstrates schematic and cross-section of the layer-by-layer film after annealing process.

FIG. 23A Initial Ni/UNCD/Silicon configuration; FIG. 23B FIB patterning to produce the hall in Ni/UNCD film; FIG. 23C lateral growth of graphene film over the hole after RTP annealing procedure.

FIGS. 24A and 24B demonstrate SEM images of graphene grown on diamond with selective growth of graphene also being confirmed with corresponding Raman signatures of UNCD FIGS. 24C and graphene 24D.

FIGS. 28A show the effect of orientation of the underlying Ni substrate on graphene growth. Snapshots of atomic configuration are shown at different times during annealing of amorphous carbon deposited on Ni substrates in our MD simulations; the Ni substrates are oriented with surface normal along 111 (FIGS. 28A-D) and 001 (FIGS. 28E-H) directions, diring the annealing process, amorphous carbon undergoes ordering resulting in monolayer graphene sheet with nearly full coverage on Ni(111), while graphene patches with significant number of holes and defects are obtained on Ni(001); graphene growth on Ni(111) is favored due to the presence of close-packed triangular moiety of Ni atoms (FIG. 28D) as compared to the square/rectangular arrangement of Ni atoms in 001 plane (FIG. 28H).

FIG. 29 is an optical image of top-gated graphene device fabricated. Scale bar is 100 μm.

DETAILED DESCRIPTION OF PREFERRED EMBODIMENTS

Figure 1:
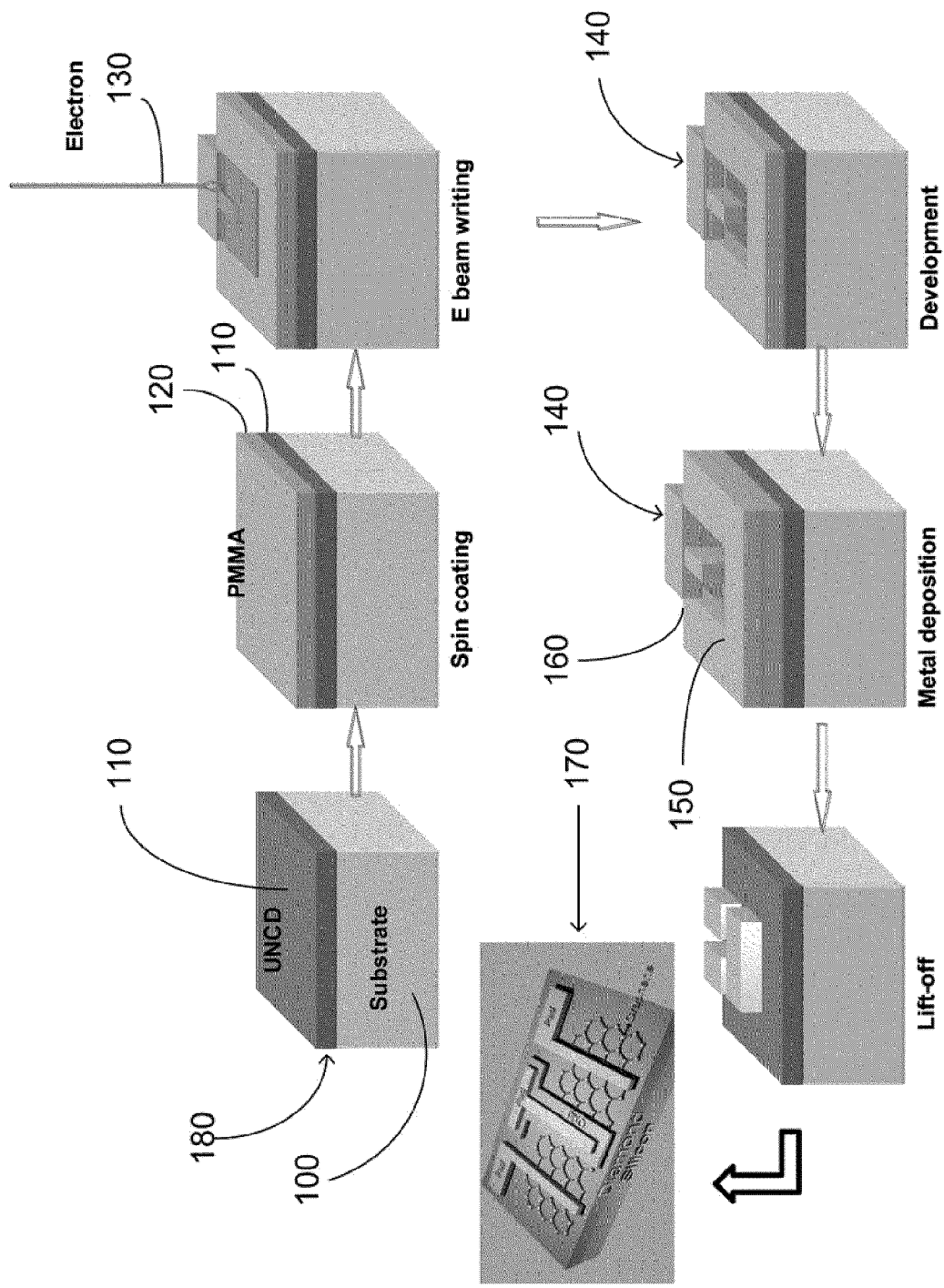
FIG. 1 illustrates a schematic of a top-down fabrication method for providing a graphene based device on a diamond substrate.

In one embodiment graphene-based devices can be fabricated by a top-down methodology to create graphene on a synthetic diamond substrate. As shown in FIG. 1 a starting material 100 can be either single crystal diamond or UNCD/NCD ("nanocrystalline diamond") thin film deposited on a silicon substrate with a transferred graphene layer 110 on the top. The next step in the process is to spin coat a photoresist 120 followed by e-beam lithography 130 to pattern the graphene layer 110 and perform a reactive ion etch (RIE) to transfer the pattern 140. The next step is deposition of Au/Ti as metal contacts 150. A gate dielectric of $HfO_2$ 160 is also deposited using an atomic layer deposition (hereinafter "ALD") process for three terminal devices. Finally, a lift-off process is used to etch away extra metal from unwanted regions. The final configuration of device 170 is as shown in a schematic displayed as an inset at the end of process flow-chart.

Figures 2A, 2B:
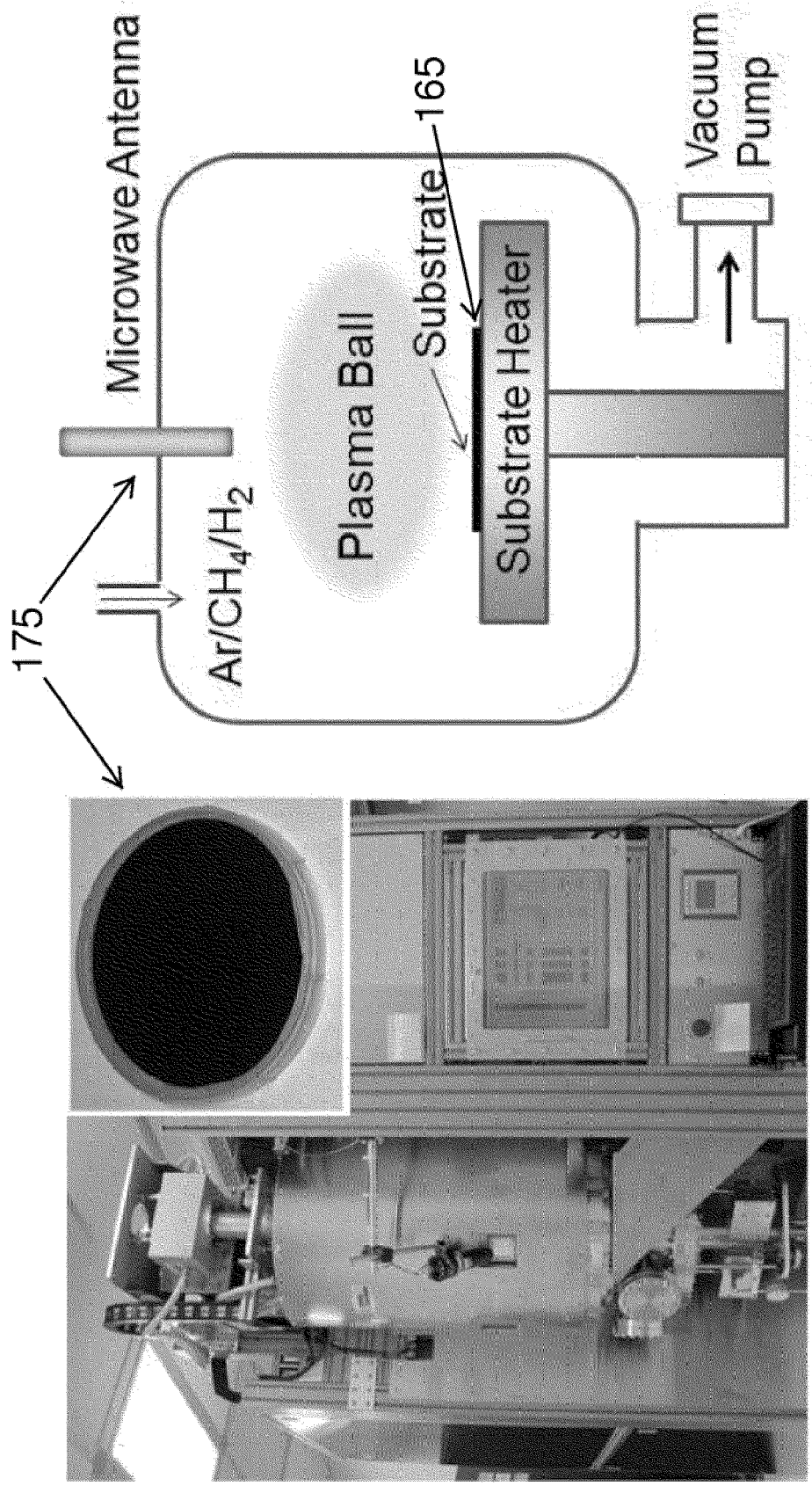
FIG. 2A illustrates an MPCVD system used to implement the schematic method of FIG. 1.
FIG. 2B provides a schematic describing UNCD growth in a MPCVD system.

The UNCD films for this study were grown on Si substrates 165 in a conventional microwave plasma chemical vapor deposition (MPCVD) system 175 at the Argonne National Laboratory (ANL). FIGS. 2A and 2B show the MPCVD system 175 used for the growth inside a cleanroom and schematic of the process, respectively. The growth conditions were altered to obtain larger D, in the range 5-10 nm, instead of typical grain sizes D≈2-5 nm in UNCDs. This was done to increase K of UNCD without strongly increasing the surface roughness. We intentionally did not increase D beyond 10 nm or used MCD in order to keep δH in the range suitable for polishing. The inset shows a 100-mm UNCD/Si wafer. Details of the original growth process developed at ANL are described hereinafter.

Figure 2C:
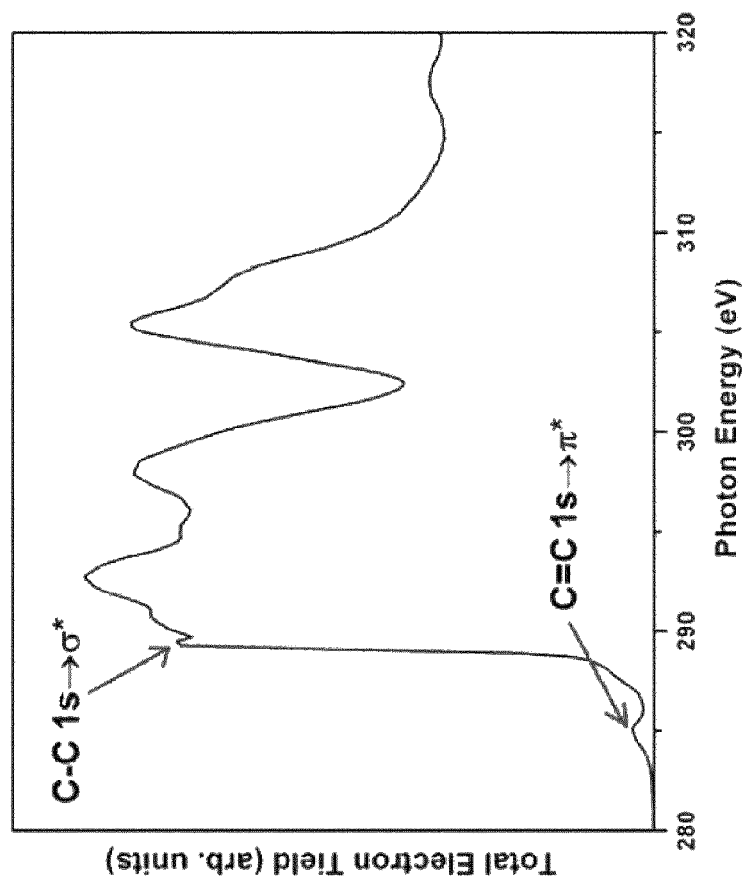
FIG. 2C illustrates NEXAFS data for deposited UNCD thin films.
Figure 2D:
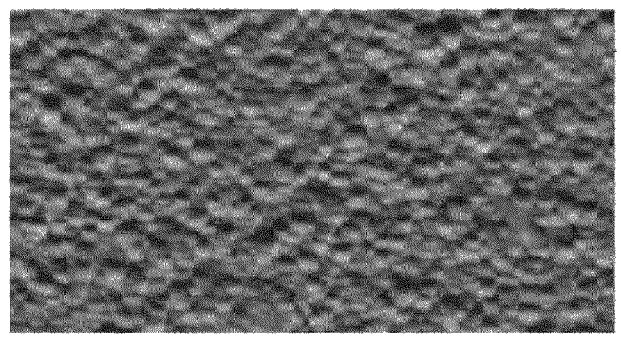
FIG. 2D illustrates an AFM image of as grown UNCD.
Figure 2E:
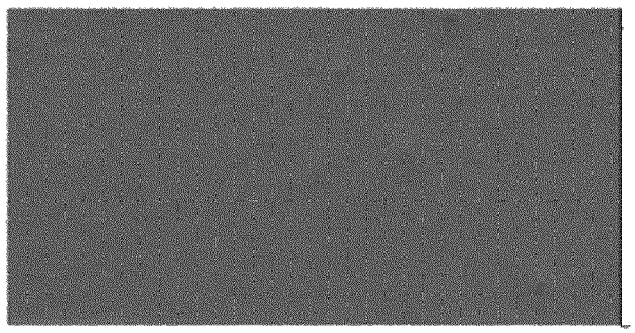
FIG. 2E illustrates an AFM image of chemically/mechanically polished UNCD.

The surface roughness of the synthetic diamond substrate 100 plays an important role in reducing electron scattering at the graphene-diamond interface 180 and increasing the electron mobility, μ. We performed the chemical mechanical polishing (hereinafter "CMP") to reduce the as-grown surface roughness from δH≈4-7 nm to below δH≈1 nm, which resulted in a corresponding reduction of the thickness, H, from the as-grown H≈1 μm to ~700 nm. The H value was selected keeping in mind conditions for graphene visualization on UNCD together with the thermal management requirements (see Example I). The SCD substrates 100 were type IIb (100) grown epitaxially on a seed diamond crystal and then laser cut from the seed. For the graphene devices 170 fabrication, the SCD substrates 100 were acid washed, solvent cleaned and put through the hydrogen termination process in a conventional manner. The near-edge ray absorption fine-structure spectrum (NEXAFS) of the grown UNCD film 100 confirms its high $sp^3$ content and quality (FIG. 2C). The strong reduction of δH is evident from the atomic force microscopy ("AFM" hereinafter) images of the as grown UNCD and UNCD after CMP presented in FIGS. 2D and 2E, respectively. The surface treatment procedures developed for this study are described in the "Methods" subsection hereinafter.

Figure 2F:
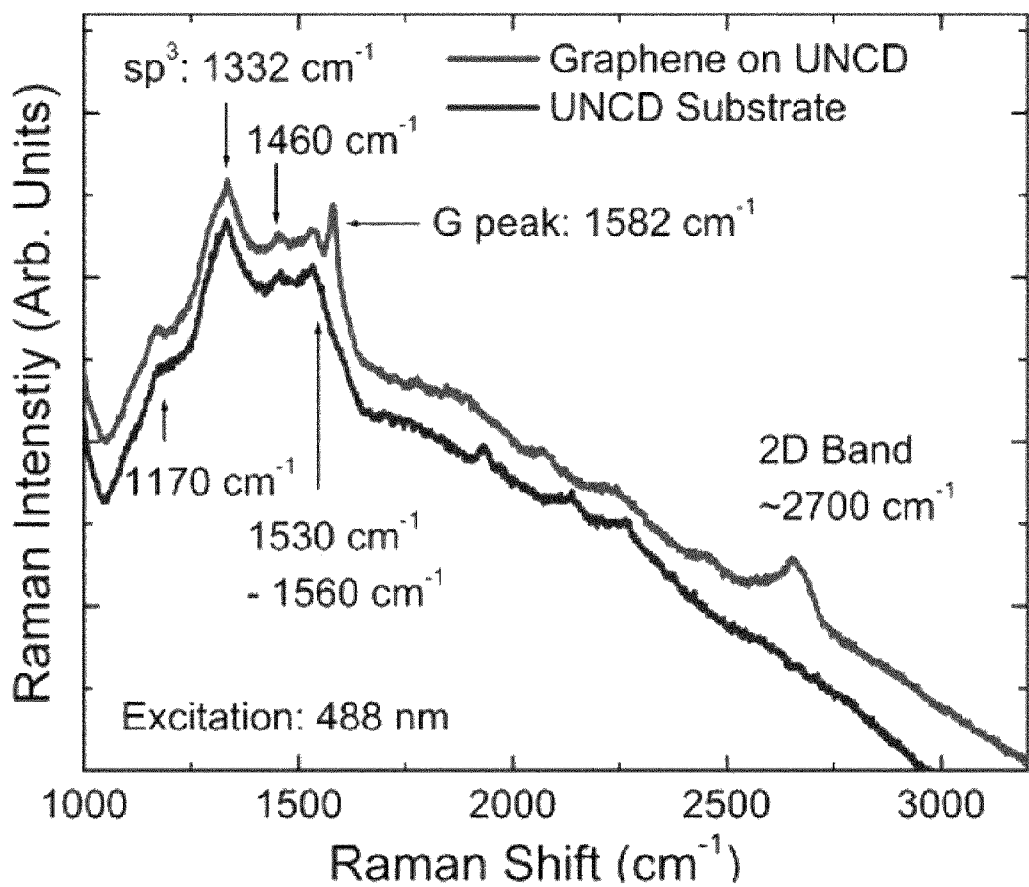
FIG. 2F illustrates Raman spectra of graphene on UNCD and separately for the UNCD substrate.
Figure 2G:
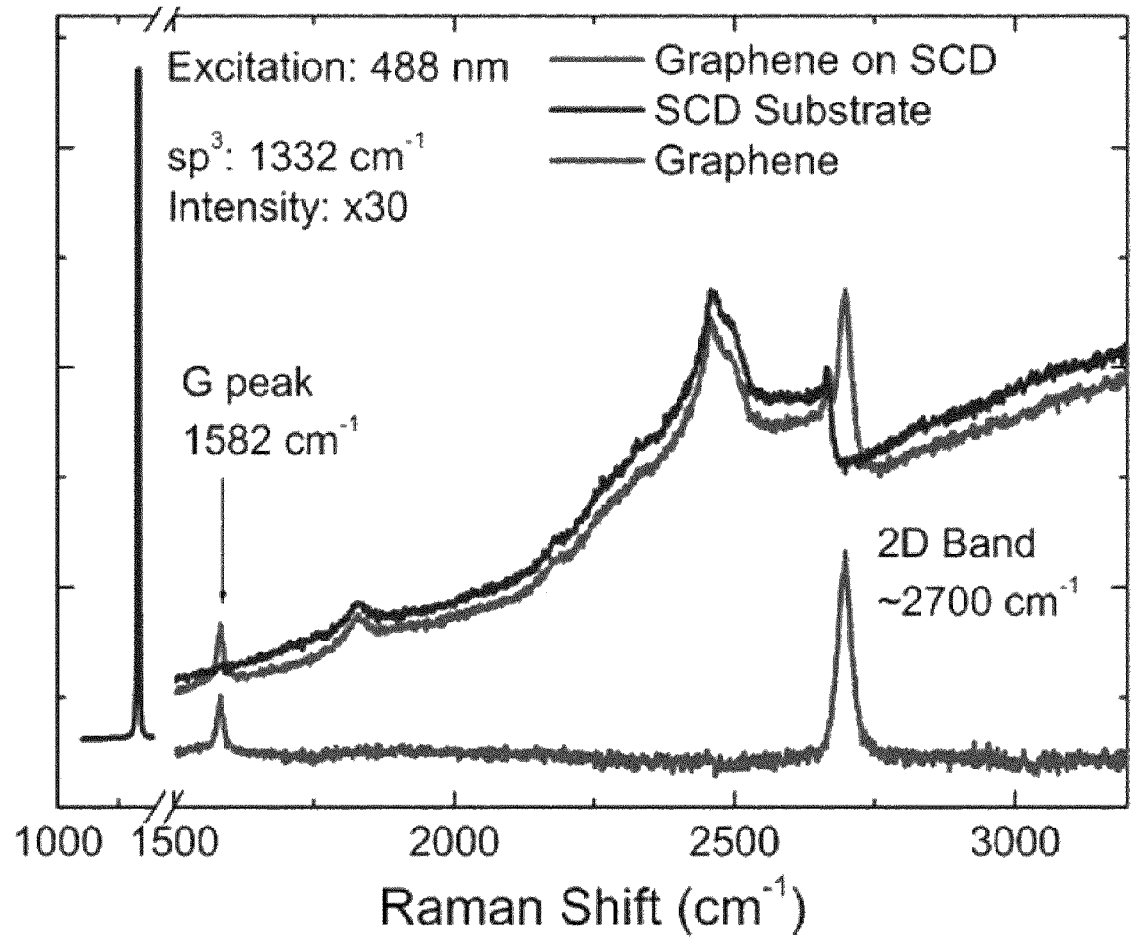
FIG. 2G illustrates Raman spectra of graphene on SCD and the SCD substrate.

The graphene and few-layer graphene ("FLG" hereinafter) were prepared by exfoliation from the bulk highly oriented pyrolytic graphite to ensure the highest quality and uniformity. We selected flakes of the rectangular-ribbon shape with the width W≥1 μm, which is larger than the phonon mean free path Λ~750 nm in graphene. The condition W>Λ ensured that K does not undergo additional degradation due to the phonon-edge scattering, allowing us to study the breakdown limit of graphene itself. The length, L, of graphene ribbons was in the range of about 10-60 µm. We further chose ribbons with the small aspect ratio γ=W/L~0.03-0.1 to imitate interconnects. Raman spectroscopy was used for determining the number of atomic planes, n, in FLG although the presence of $sp^2$ carbon at the grain boundaries in the UNCD 100 made the spectrum analysis more difficult. FIG. 2F shows spectra of the graphene-on-UNCD/Si and UNCD/Si substrate. One can see a 1332 $cm^{-1}$ peak, which corresponds to the optical vibrations in the diamond crystal structure. The peak is broadened due to the small D in UNCD. The bands at ~1170, 1500 and 1460 $cm^{-1}$ are associated with the presence of trans-poly-acetylene and $sp^2$ phase at grain boundaries. The graphene G peak at 1582 $cm^{-1}$ and 2D band at ~2700 $cm^{-1}$ are clearly recognizable. FIG. 2G presents spectra of the graphene-on-SCD, SCD substrate and difference between the two. The intensity and width of 1332 $cm^{-1}$ peak confirms that we have single-crystal diamond.

In preferred embodiments the devices 170 were made of FLG with n≤5. FLG supported on substrates or embedded between dielectrics preserves its transport properties better than single layer graphene. Two-terminal (i.e., interconnects) and three-terminal (i.e., FETs) devices were fabricated on both UNCD/Si and SCD substrates. The electron-beam lithography (EBL) was used to define the source, drain contacts, and gate electrodes. The contacts consisted of a thin Ti film 200 covered by a thicker Au film 210. A top-gate $HfO_2$ dielectric layer 230 was grown by the atomic layer deposition ("ALD" hereinafter). In a preferred embodiment as compared to a basic prior art graphene-on-$SiO_2$/Si devices, the gate electrode 220 and the graphene pad 110 were completely separated by the $HfO_2$ dielectric layer 230 to avoid oxide lift-off sharp edges, which can affect connection of the gate electrode 220. FIGS. 3A(1) and (2) show schematics of the fabricated devices 170 with details. For testing the breakdown current density in FLG we used two-terminal devices 230 in order to minimize extrinsic effects on the current and heat conduction. Three-terminal devices 240 were utilized for µ mobility measurements. Conventional graphene-on-$SiO_2$/Si devices were prepared as references. FIG. 3B is an optical microscopy image of a two terminal graphene-on-SCD device. FIGS. 3C and 3D show the scanning electron microscopy (SEM) images of the two-terminal and three-terminal graphene-on-UNCD devices, respectively.

Figure 4A:
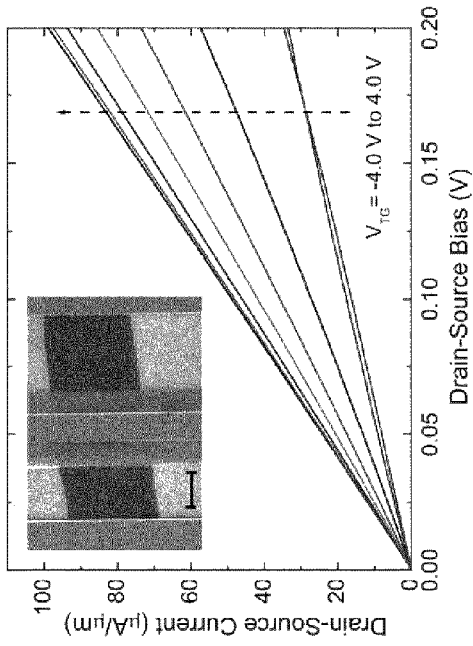
FIG. 4A illustrates thermal resistance of an UNCD/Si substrate and a reference Si wafer.

In a preferred embodiment characterization was performed for >40 in number of the graphene-on-diamond devices 170 and for >10 in number of the graphene-on-$SiO_2$/Si reference devices 170. To understand the origin of the breakdown $J_{BR}$ values were correlated with the thermal resistances of the substrates. The effective K of the substrates was measured and their thermal resistance determined as $R_T=H_S/K$, where $H_S$ is the substrate thickness. For details of the thermal measurements see Example I. FIG. 4A shows thermal resistance, $R_T$, for the UNCD/Si and Si/$SiO_2$ (300-nm) substrates as a function of T. Note that $R_T$ for Si increases approximately linear with T, which is expected because the intrinsic thermal conductivity of crystalline materials decreases as K~1/T for T above RT. The T dependence of $R_T$ for UNCD/Si is notably different, which results from interplay of heat conduction in UNCD and Si. In UNCD, K grows with T due to increasing inter-grain transparency for the acoustic phonons that carry heat. UNCD/Si substrates, despite being more thermally resistive than Si wafers at RT, can become less thermally resistive at high T. The $R_T$ value for SCD substrate is ~0.25×$10^{-6}$ $m^2K/W$, which is more than order-of-magnitude smaller than that of Si at RT. The thermal interface resistance, $R_B$, between FLG and the substrates is $R_B≈10^{-8}$ $m^2K/W$, and it does not strongly depend on either n or the substrate material. For this reason, $R_B$ does not affect the $R_T$ trends.

Figure 4B:
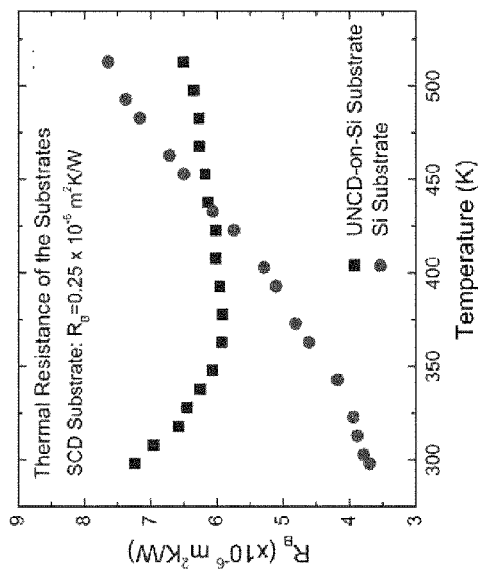
FIG. 4B illustrates low field current voltage characteristics of a top gate graphene layer on a SCD device.
Figure 4C:
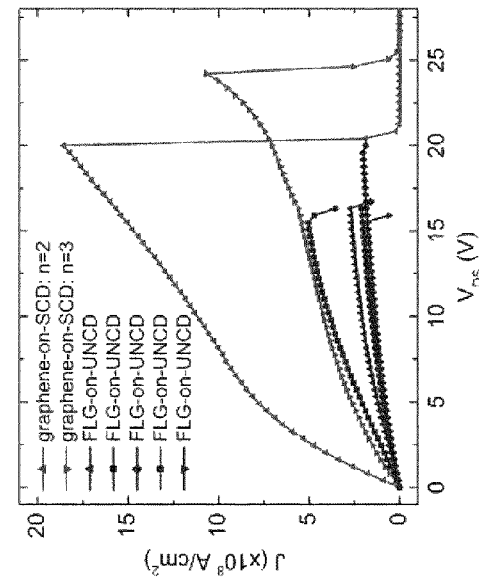
FIG. 4C illustrates source drain current for the three terminal graphene layer deposited on an UNCD device as a function of top gate voltage bias.
Figure 4D:
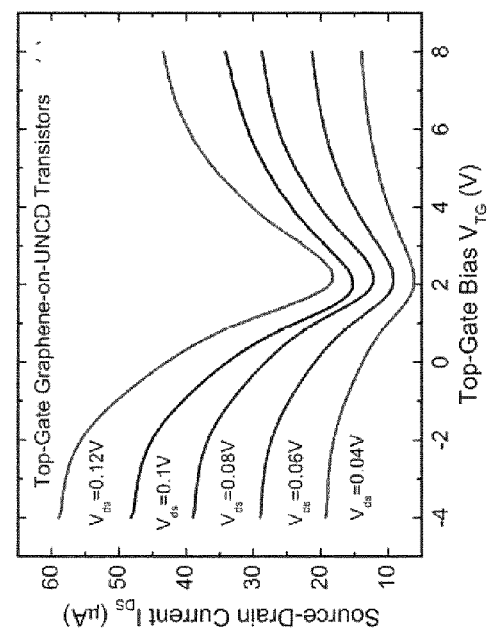
FIG. 4D illustrates breakdown current density in the two dimensional graphene on UNCD and graphene layer on a SCD device.

FIG. 4B shows current-voltage (I-V) characteristics of graphene-on-SCD FET at low source-drain voltages for different top-gate, $V_{TG}$, bias. The inset demonstrates a high quality of the $HfO_2$ dielectric and metal gate deposited on top of graphene channel. The linearity of I-Vs confirms that the contacts are Ohmic. FIG. 4C presents the source-drain, $I_{SD}$, current as a function of $V_{TG}$ for graphene-on-UNCD FET. In the good top-gate graphene-on-diamond devices the extracted µ was ~1520 $cm^2V^{-1}s^{-1}$ for electrons and ~2590 $cm^2V^{-1}s^{-1}$ for holes. These mobility values are acceptable for applications in downscaled electronics. In FIG. 4d we show results of the breakdown testing. For graphene-on-UNCD, we obtained $J_{BR}≈5×10^8$ $A/cm^2$ as the highest value, while the majority of devices broke at $J_{BR}≈2×10^8$ $A/cm^2$. The reference graphene-on-$SiO_2$/Si had $J_{BR}≈10^8$ $A/cm^2$, which is consistent with conventional findings. The maximum achieved for graphene-on-SCD was as high as $J_{BR}≈1.8×10^9$ $A/cm^2$. This is an important result, which shows that via improved heat removal from graphene channel one can reach, and even exceed, the maximum current-carrying capacity of ~10 $µA/nm^2$ (=1×$10^9$ $A/cm^2$) reported for CNTs. Without limiting the invention, the surprising improvement in $J_{BR}$ for graphene-on-UNCD is explained by the reduced $R_T$ at high T where the failure occurs. At this temperature, $R_T$ of UNCD/Si can be lower than that of Si/$SiO_2$ (see FIG. 4A).

The location of the current-induced failure spot and $J_{BR}$ dependence on electrical resistivity, ρ, and length, L, can shed light on the physical mechanism of the breakdown. While not limiting the scope of the invention, the failures in the middle of CNTs and $J_{BR}$~1/ρ were interpreted as signatures of the electron diffusive transport, which resulted in the highest Joule heating in the middle. The failures at the CNT-metal contact were attributed to the electron ballistic transport through CNT and energy release at the contact. There is a difference in contacting CNT with the diameter d~1 nm and graphene ribbons 110 with W≥1 µm. It is easier to break CNT-metal than the graphene-metal contact thermally. In our study, we observed the failures both in the middle and near the contact regions (see FIG. 5). The difference between these two types was less pronounced than that in CNTs. The failures occurred not exactly at the graphene-metal interface but on some distance, which varied from sample to sample. We attributed it to the width variations in graphene ribbons leading to breakdowns in the narrowest regions, or in the regions with defects, which are distributed randomly. We did not observe scaling of $J_{BR}$ with ρ like in the case of CNTs.

Figure 5:
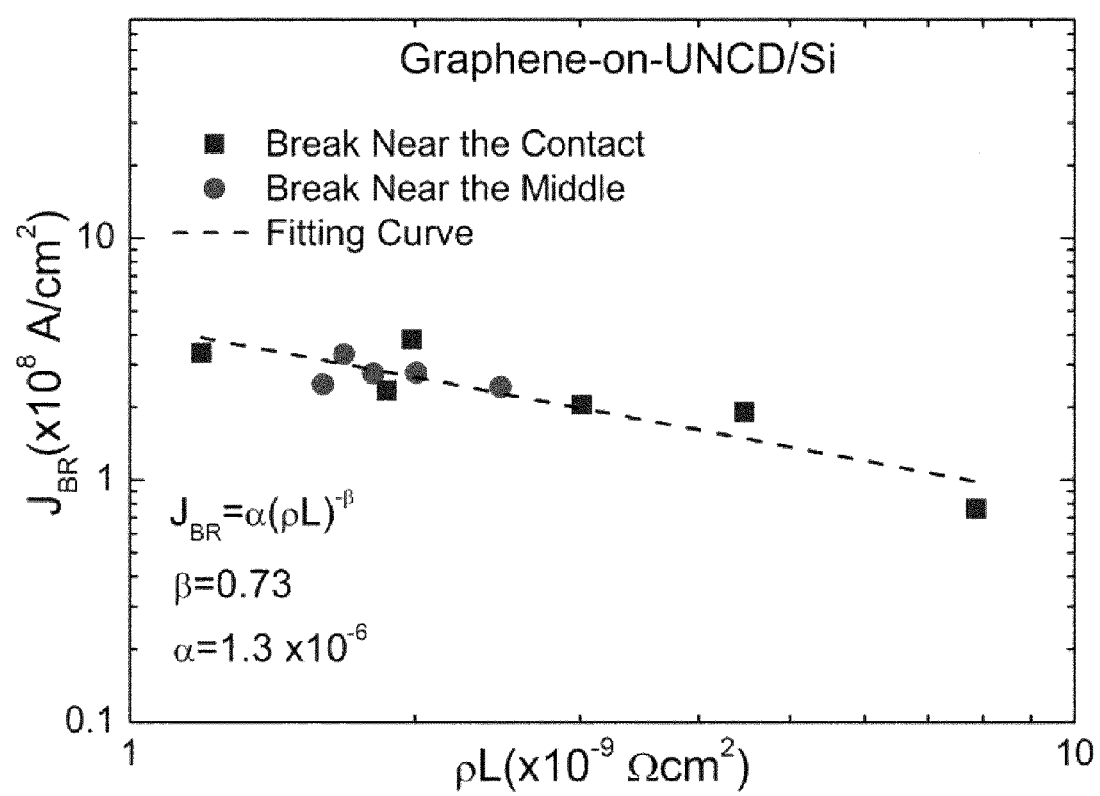
FIG. 5 illustrates scaling of breakdown current density wherein $J_{BR}$ is shown as a function of electrical resistance and length of graphene interconnects.

$J_{BR}$ for graphene scaled well with ρL, and FIG. 5 shows data for graphene-on-UNCD with a similar aspect ratio. From the fit to the experimental data we obtained $J_{BR}=α(ρL)^β$, where α=1.3×$10^{-6}$ and β=0.73. For graphene-on-SCD, the slope is β=0.51. Previously, the scaling with $(ρL)^{-β}$ (where β=0.6-0.7) was observed in carbon nanofibers (CNF), which had a similar aspect ratio. Such $J_{BR}(ρL)$ dependence was explained from the solution of the heat diffusion equation, which included thermal coupling to the substrate. However, the thermally induced $J_{BR}$ for CNF was ~$10^6$ $A/cm^2$—much smaller than the record $J_{BR}≈1.8×10^9$ $A/cm^2$ we obtained for graphene-on-SCD.

In a preferred embodiment, the UNCD thin films were grown on 100-mm diameter Si substrates 165 in the 915 MHz large-area microwave plasma chemical vapor deposition ("MPCVD" hereinafter) system 175 (DiamoTek 1800 series 915 MHz, 10 KW from Lambda Technologies Inc.) operating in the clean room at the Argonne National Laboratory. Prior to the growth, silicon substrate were deposited with 10 nm tungsten layer using sputter deposition process followed by nanodiamond seeding treatment using the nanodiamond suspension containing dimethylsulphoxide (DMSO) solution (ITC, Raleigh, N.C.). Details about MPCVD and seeding process for the UNCD growth are described in Example I. The single crystal diamonds used for this study were type IIb with (100) orientation (Delaware Diamond Knives) polished from both sides down to ~3-nm RMS roughness. A pre-cleaning procedure using acid wash and solvent cleaning was used to etch any contaminants from the surface. The H-termination process with microwave plasma was carried at the substrate T=700° C. using $H_2$ flow of 50 sccm and chamber pressure of 30 mbar for 10-15 mins. The process eliminates any hydrocarbon and oxygenated impurities and produces clean terminated diamond surface. We defined the top-gate region using EBL (NPGS controlled Leo 1550) and performed ALD (Cambridge Nanotech) of 20-nm thick $HfO_2$ at T=110° C. The lift-off of ALD was done in hot acetone (T=60° C.) for ~2 hours. We often observed oxide leftovers at the edges of the defined 9 regions, which can lead to discontinuities in the following metal layer. To avoid this problem, we designed $HfO_2$-layer insert under the entire region of gate electrode and pad. We then used EBL to define the source, drain and top gate electrodes regions and deposit Ti/Au (10 nm/100 nm) by E-beam evaporator (Temescal BJD-1800).The gate leakage in our devices was very low (much smaller than 0.1 $nA/\mu m_2$). We established that our polished UNCD/Si substrates do not require a seeding layer for ALD of $HfO_2$ gate dielectric.

In yet another embodiment, the graphene 110 can be grown at low temperatures (about 400-500° C.). Preferably this process involves graphene growth directly on an Ni surface 250 on a substrate (like the diamond substrate 100) using a solid carbon precursor which allows graphene growth of single or multiple layers in a highly controlled manner. Such a method is quite compatible with complementary metal oxide semiconductor ("MOS" hereinafter) manufacturing processes.

In this preferred embodiment illustrated schematically in FIGS. 13A-13C, several steps are used to produce the desired graphene layers. The substrate is preferably Ni which can take the form of Ni thin film (such as, for example, 300 nm) or even bulk Ni foil. In the case of thin film Ni as the substrate, the Ni thin film 250 is deposited on the silicon substrate 165 with the intermediate titanium (Ti) adhesion layer 200 (thickness: 10-20 nm) (see FIG. 13A). In other embodiments other catalytically suitable, like-performing transition metal or transition metal alloys substrates can be used to support the polymer layer 280 deposited thereon for processing. Further, the base substrate need not be a Si substrate 165, but can be any compatible substrate known in the art. In addition other conventional adhesion layers 200 can be used besides Ti which are compatible with the transition metal layer 250. The use of a silicon dioxide ($SiO_2$) layer 270 is not required but could be used in case of device isolation. The next step in the process in FIG. 13B is to mix two polymers 280 in the solid form (n-octacosane and n-tetracosane) in 1:1 (wt. percentage) and heat the mixture on a hot plate to a temperature of about 80° C. so that it converts into a viscous liquid form. It is also important to note that these polymers have a relatively low melting point (less than about 80° C.) and high vapor pressure. Therefore, they decompose at very low temperatures which is essential for the low temperature growth of graphene. Also in the preferred embodiment only the combination of both of these polymers in the previously mentioned (in wt %) concentration works to facilitate the growth of graphene on Ni at low temperatures. Use of only one of these polymers will not work. Therefore it is important to note that other polymers containing a similar mixture of saturated aliphatic hydrocarbon and alkane hydrocarbon with low melting point will also work for our process.

The prepared polymer solution is then spin-coated on the surface of the Ni film 250 followed by cooling the substrate 165 to room temperature so that the polymer solution converts into a thick solid layer. The polymer coated Ni substrate 250 is then transferred into the vacuum furnace for graphene growth. The Ar gas (2000 sccm) was then flown into the chamber with the chamber pressure maintained at 300 Torr. The temperature of the vacuum furnace was then raised at around 400-500° C. and maintained for 15-20 mins. This process essentially discomposes the polymer layer on the top of the surface of the Ni 250 and starts precipitating a carbon rich layer on the Ni surface 250. In the next step shown in FIG. 13C, the substrate 165 is cooled from 400-500° C. to room temperature at the rate of about 15-30° C./min. This rapid cooling rate converts the graphitic carbon into the graphene layers 110. The yield and quality of the graphene layers 110 can be improved further by using carbon precursor gas to accelerate the growth of graphene 110. In that case, an Ar/Ethanol gas mixture can be flowed into a chamber during the growth at 400-500° C. for few minutes to grow large grain size of the graphene 110.

In FIGS. 14A and 14B are shown the Raman spectra of the graphene 110 grown at 400° C. and corresponding optical micrograph of the Ni surface 250 respectively, confirming the graphene growth. FIGS. 14C and 14D show the Raman spectra of the graphene 110 grown at 500° C. and corresponding optical micrograph of the Ni surface 250 respectively. The graphene quality is better at higher temperature as expected.

This method therefore allows growing multilayer graphene 110 on Ni substrate 250 at low temperature (about 400-500° C.). This method also allows growth of graphene 110 at temperatures compatible with a typical CMOS thermal budget, which opens-up the possibility of integration of the graphene 110 with CMOS electronics. This is a crucial step in developing graphene based hybrid devices with efficient thermal management. No source of carbon containing gas for the graphene growth is required since a polymer layer coated on the substrate itself acts as a solid carbon source. The low temperature process requires less energy than the conventional growth process that occurs at 1000° C., which directly affects economics of fabricating graphene devices on commercial scale. The low temperature growth process was done on a 4 inch diameter wafer but could be easily scalable to large area.

METHODS

The near edge ray absorption fine structure spectroscopy (NEXAFS) of the UNCD sample was carried out at the University of Wisconsin Synchrotron Radiation Center Facility. The data was acquired at HERMON beam at carbon K edge with high energy resolution (0.2-0.4 eV). The spectra were taken in the total electron yield (TEY) mode with the incident photon beam normal to the sample. Special care was taken to correct for the carbon contamination from the X-ray beam optics and transmission structure from the monochromator. Details of the measurements are described in the Examples.

Figure 6:
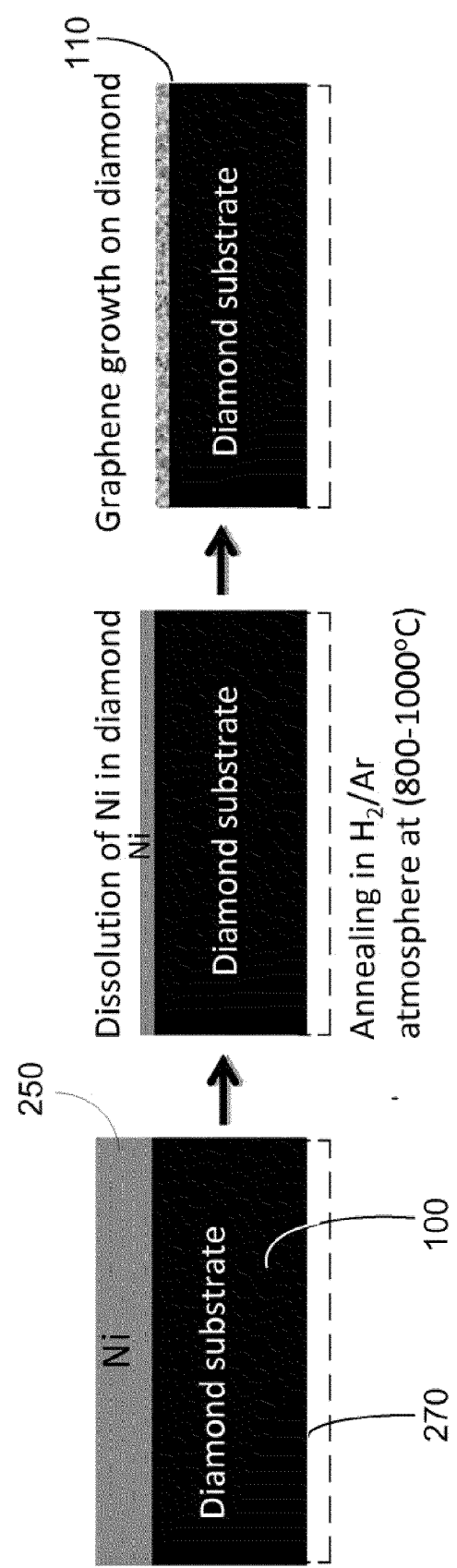
FIG. 6 illustrates a schematic diagram of process steps to obtain direct graphene growth on diamond.
Figure 7B:
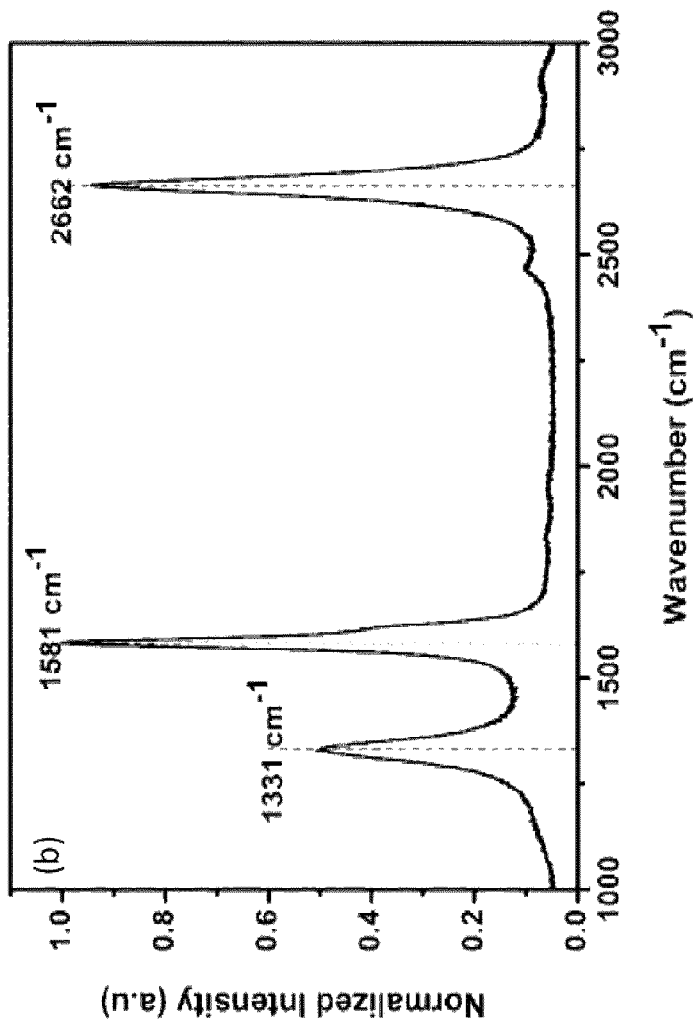
FIG. 7B illustrates Raman spectra confirming growth of a few nm thick layer graphene on the diamond.
Figure 7A:
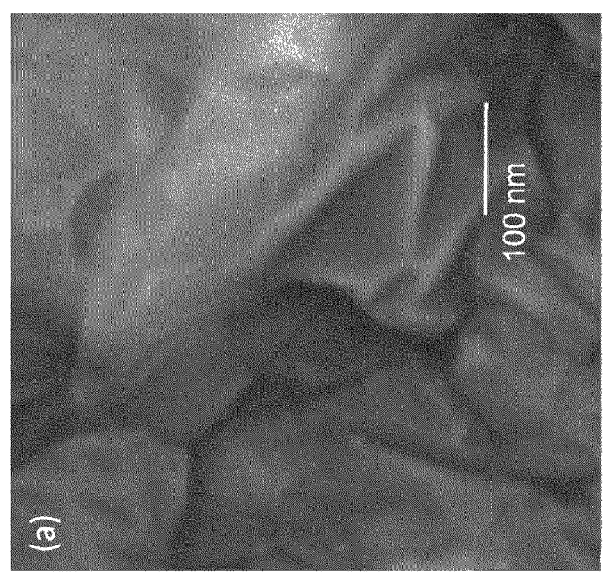
FIG. 7A illustrates an SEM image of a diamond film covered with conformal graphene layer.

In the embodiment of direct growth of graphene on a diamond substrate, as shown in FIG. 6 the starting material is either single crystal diamond 100 or UNCD/NCD thin film 100 deposited on a silicon substrate 260 (shown in phantom) with Ni thin film (typical thickness: 30 nm) 250 deposited on the top of the diamond 100 or the UNCD/NCD thin film 100. The next step in the process is to anneal the substrate in vacuum furnace in $H_2$/Ar gas mixture (50:50 ratio) at around 800-1000° C., for 15-20 mins. In one embodiment, the substrate is heated to the annealing temperature in about 30s for annealing. This process essentially dissolves the Ni 250 into the diamond 100 due to the strong catalytic reaction with the diamond 100. During this process, part of the Ni 250 diffuses into the diamond 100 and starts graphitizing the diamond 100. At the end of this process, a few nanometers of the diamond surface from the top surface is completely graphitized; and the layer mostly consists of graphitic carbon. The next step, involves cooling the substrate from 800-1000° C. to room temperature with the rate of about 30° C./min at the beginning to about 15° C. at the end. In one embodiment, the cooling is performed at a rate of about 600° C./minute. This rapid cooling rate converts the graphitic carbon into the graphene layers 110. The yield and quality of the graphene layers 110 could be improved further by using a carbon precursor gas to accelerate the growth of the graphene 110. In that case, we used As/Ethanol gas mixture at 1000° C. for few minutes to grow large grain size graphene 110. It is preferable that the Ni content should be small enough so that it ends up utilizing all of the Ni during the growth; and therefore the high quality growth of the graphene 110 can be achieved without trace amount of Ni in sub-surface regions of the diamond 100.

In one embodiment, a rather than a normal high temperature vacuum oven technique, a Rapid Thermal Annealing "RTA" is utilized. An implementation of such is illustrated below in Example III. This is significant development over existing methods which mostly produce polycrystalline graphene and requires 4-5 hours in total for a single graphene growth run. Additionally, it has been shown that the RTP process can produce graphene on wafer-scale (4" wafer) and can be extended to even large area. With increased interest in two-dimensional carbon material, graphene, the challenges in growing the large scale high quality films become a main hurdle for using it in different applications, such as coatings, bio sensors, microelectronics, photonics, etc. Most of the existing methods have certain limitations. Mechanical exfoliation, commonly used in research, is not suitable for large areas. Molecular assembly, used for nanoelectronics, is costly and commercially not viable. Liquid-phase exfoliation results in impurities and discontinuity of the films, which is not suitable for device fabrication. Chemical vapor deposition (CVD) process requires additional transfer process. Existing methods of graphene growth on SiC are costly and require high temperature. Diamond offers several unique properties such as low trap density for charges, chemically inert, and high thermal conductivity. Moreover, diamond by itself showed a lot of useful applications in MEMS and in bio-medical sensors.

One embodiment relates to a process based on rapid thermal annealing of diamond film in the presence of metal catalyst is promising as compared to other existing methods of growing graphene without the transfer process. The MD simulation results discussed below indicate new mechanism of graphene nucleation through initiation of graphene nucleation on Ni(111) and enhanced graphene growth through continuous supply of carbon from the amorphized diamond underneath. No Nickel etching step is required since it diffuses very fast through UNCD grain boundaries and segregates at the UNCD/Si interface. The scheme of fabricating suspended graphene membranes on diamond offers unique opportunity to take full advantages of intrinsic properties of graphene, for the first time. The graphene-on-diamond platform is promising for the development of high performance nanoelectronic devices.

Figure 31:
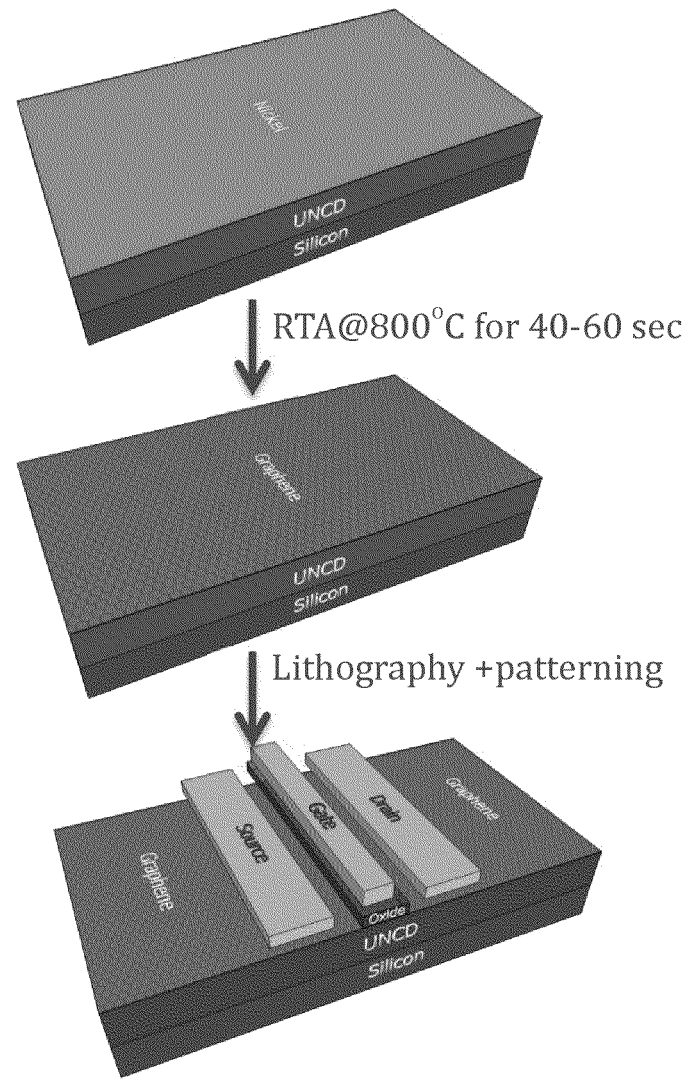
FIG. 31 illustrates Fabrication of top-gate graphene FET on diamond. The top gate graphene FETs on UNCD with good charge carrier mobility of ~2000 $cm^2V^{-1}s^{-1}$ for electrons and carrier density of ~3.5×$10^{12}$ $cm^{-2}$ is measured at RT.

FIG. 31 illustrates Fabrication of top-gate graphene FET on diamond. The top gate graphene FETs on UNCD with good charge carrier mobility of ~2000 $cm^2V^{-1}s^{-1}$ for electrons and carrier density of ~$3.5 \times 10^{12}$ $cm^{-2}$ is measured at RT.

Figure 32:
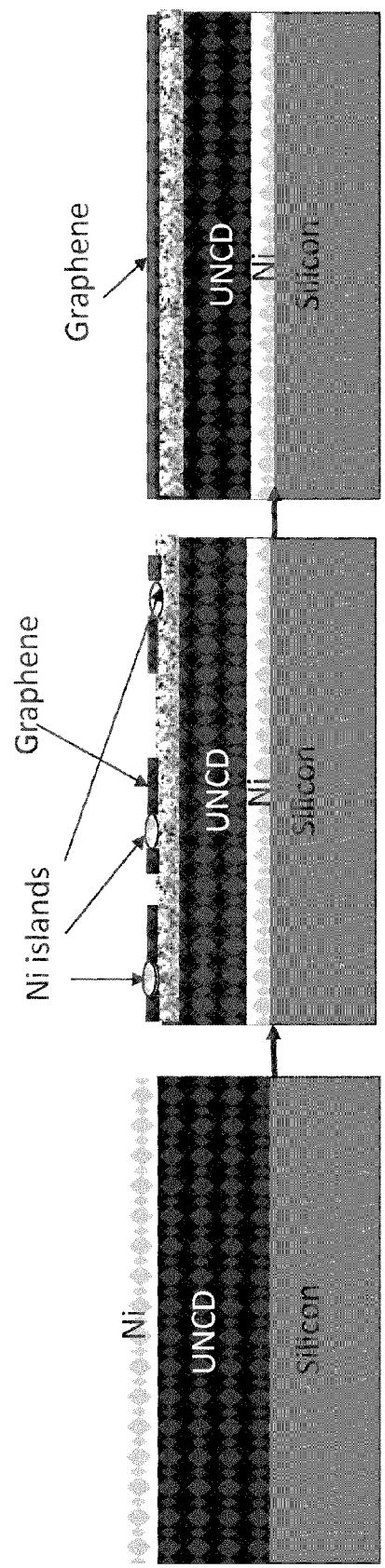
FIG. 32 illustrates a possible mechanism for the graphene growth on diamond. It should be further appreciated that nanopatterning can be possible using patterned nickel on UNCD.

FIG. 32 illustrates a possible mechanism for the graphene growth on diamond. It should be further appreciated that nanopatterning can be possible using patterned nickel on UNCD.

In one embodiment, the graphene is formed in less than a minute upon cooling. In a further embodiment, the graphene is formed between 1 nanosecond and one minute.

Example I

Figure 8:
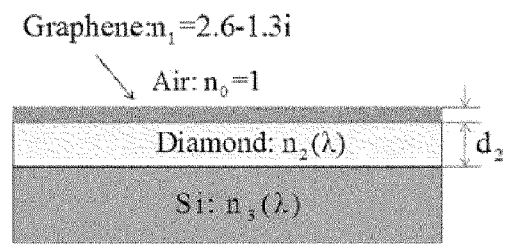
FIG. 8 illustrates a schematic of a graphene layer on a diamond/Si substrate.

Fabrication of the graphene devices 170 relies on the fact that the graphene 110 can be visualized using optical microscopy if prepared on top of UNCD/Si wafers with a certain thickness of the UNCD 100. Before the diamond growth and graphene device fabrication we estimated an approximate thickness of UNCD required to make graphene visible using Fresnel's law. The results were checked experimentally. Consider the case of normal light incidence from air (refractive index $n_o=1$) on a tri-layer structure consisting of the graphene 110, the diamond 100, and the Si 165 as shown in FIG. 8. The visibility of the graphene 110 on different types of substrates originates from both the relative phase shift and amplitude modification induced by the graphene layer 110. The complex refractive indices of silicon and diamond used in the calculations were adopted from literature The Si substrate was considered semi-infinite and the refractive indices of Si, $n_3$, were assumed to be wavelength dependent. The refractive index of graphene is assumed to be independent of λ: $n_g(\lambda)=2.6-1.3i$ Calculations of the contrast spectra were performed using conventional methods:

$$C = \frac{R_{without\_graphene}(\lambda) - R_{with\_graphene}(\lambda)}{R_{Without-graphene}(\lambda)}$$

Here $R_{without\_graphene}(\lambda)$ is the reflection spectrum from the diamond substrate and $R_{with\_graphene}(\lambda)$ is the reflection spectrum from the graphene sheet.

$$R(\lambda) = \left|\frac{r_a}{r_b}\right|^2 \quad (1)$$

$$r_a = (r_1 e^{i(\beta_1+\beta_2)} + r_2 e^{-i(\beta_1+\beta_2)} + r_3 e^{-i(\beta_1+\beta_2)} + r_1 r_2 r_3 e^{-i(\beta_1+\beta_2)}) \quad (2)$$

$$r_b = (e^{i(\beta_21+\beta_2)} + r_1 r_2 e^{-i(\beta_1+\beta_2)} + r_1 r_3 e^{-i(\beta_1+\beta_2)} + r_2 r_3 e^{-i(\beta_1+\beta_2)}) \quad (3)$$

where $r_1=(n_0-n_1)/(n_0+n_1)$, $r_2=(n_1-n_2)/(n_1+n_2)$ and $r_3=(n_2-n_3)/(n_2+n_3)$ are the reflection coefficients for different interfaces and $\beta_1=2\pi n_1(d_1/\lambda)$, $\beta_2=2\pi n_2(d_2/\lambda)$, are the phase differences when light passes through the media, which are determined by the path difference of the two neighboring interfering light beams.

Figure 9:
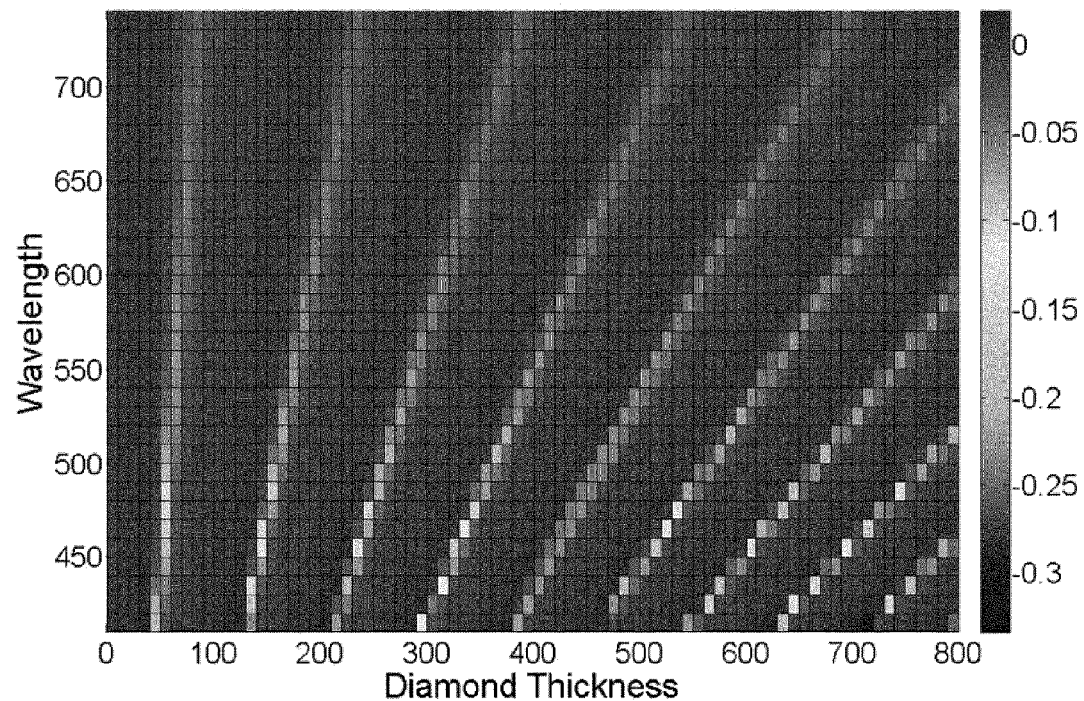
FIG. 9 illustrates a gray scale plot of contrast as a function of wavelength and diamond thickness with the gray scale contrast key on the right.
Figure 10:
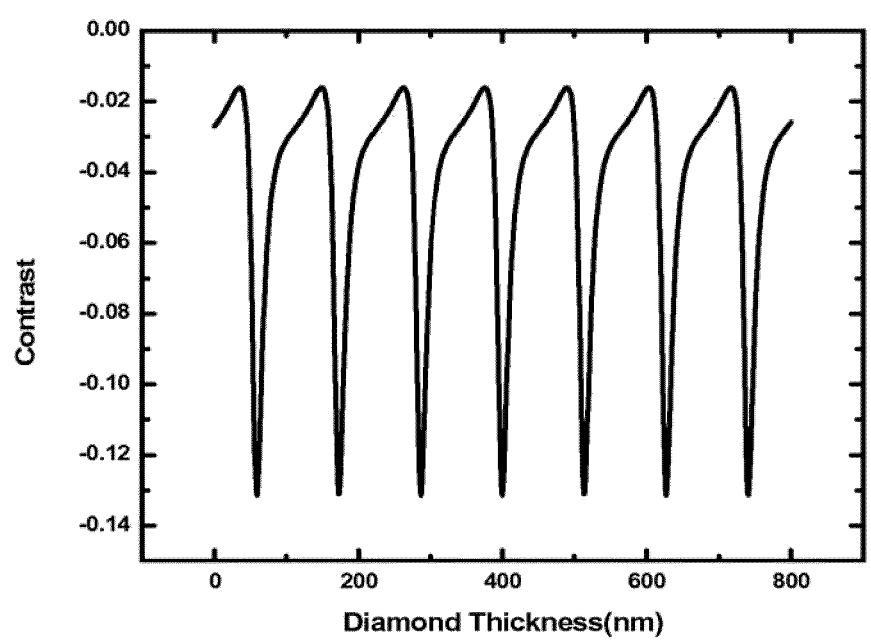
FIG. 10 illustrates contrast as a function of diamond thickness at a fixed wavelength.

The simulations were carried out using conventional MATLAB software. The incident wave was assumed to be perpendicular to the plane of the multiple layers. This is a reasonable assumption because the total thickness of graphene/diamond is much smaller than the depth of focus of the objective lens used in most experiments (0.9-1.8 μm for $\lambda$=0.4-0.8 μm and the numerical aperture of 0.95) within the depth of focus. For this reason the wave front of the focused light is almost flat. FIG. 9 shows the calculated grayscale plot for the expected contrast as a function of the diamond thickness and wavelength with the diamond thickness ranging from 0 to 800 nm and the wavelength ranging from 400 nm to 700 nm. One can see from FIG. 9 that graphene on diamond/Si exhibits a negative contrast, i.e., graphene on diamond/Si appears brighter than the substrate. Fixing the wavelength at 555 nm (the most sensitive wavelength to human eye) one gets the thickness of UNCD with the highest contrast to be around 650 nm (see FIG. 10).

Example II

The effective thermal conductivity of the polished UNCD/Si wafers was measured using the transient plane source (TPS) "hot disk" technique which is conventional and well known. The thermal conductivity of SCD was measured with the "laser flash" technique, which is more accurate for the materials with high K values. The measured thermal conductivity data was used to determine the thermal resistance of the substrates.

Figure 11:
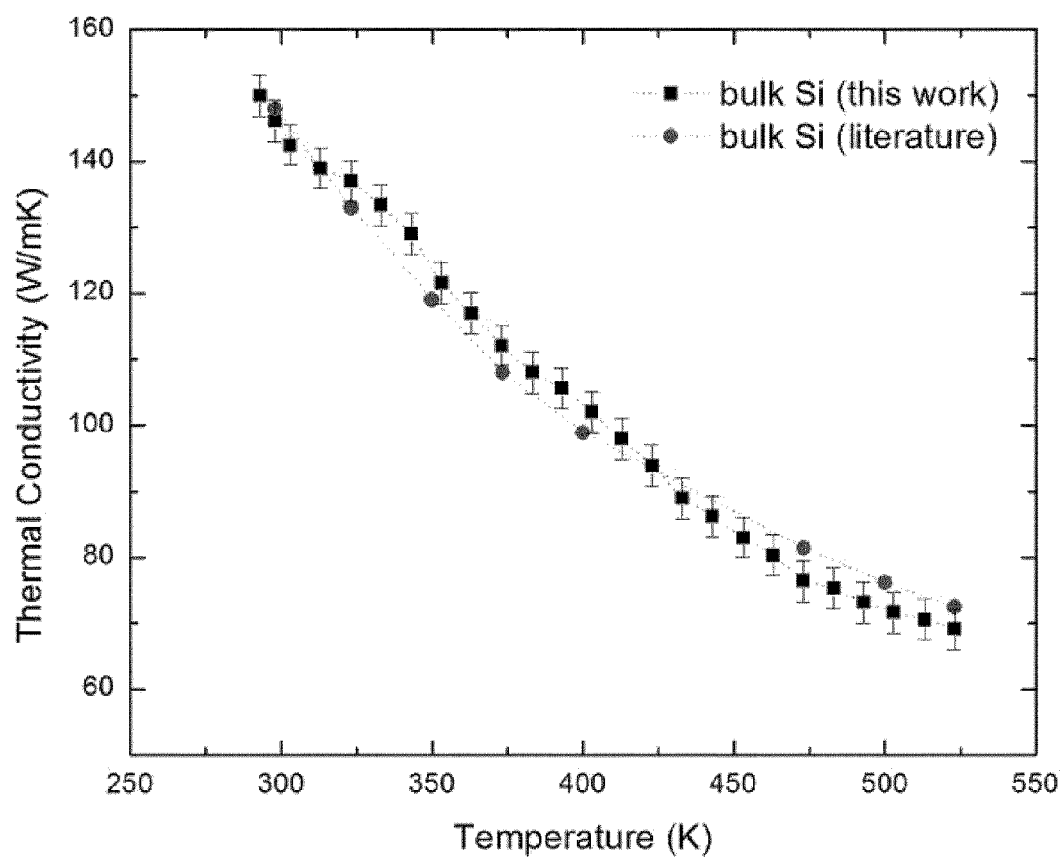
FIG. 11 illustrates thermal conductivity of Si wafers measured (squares) versus literature reported values (circles).
Figure 12:
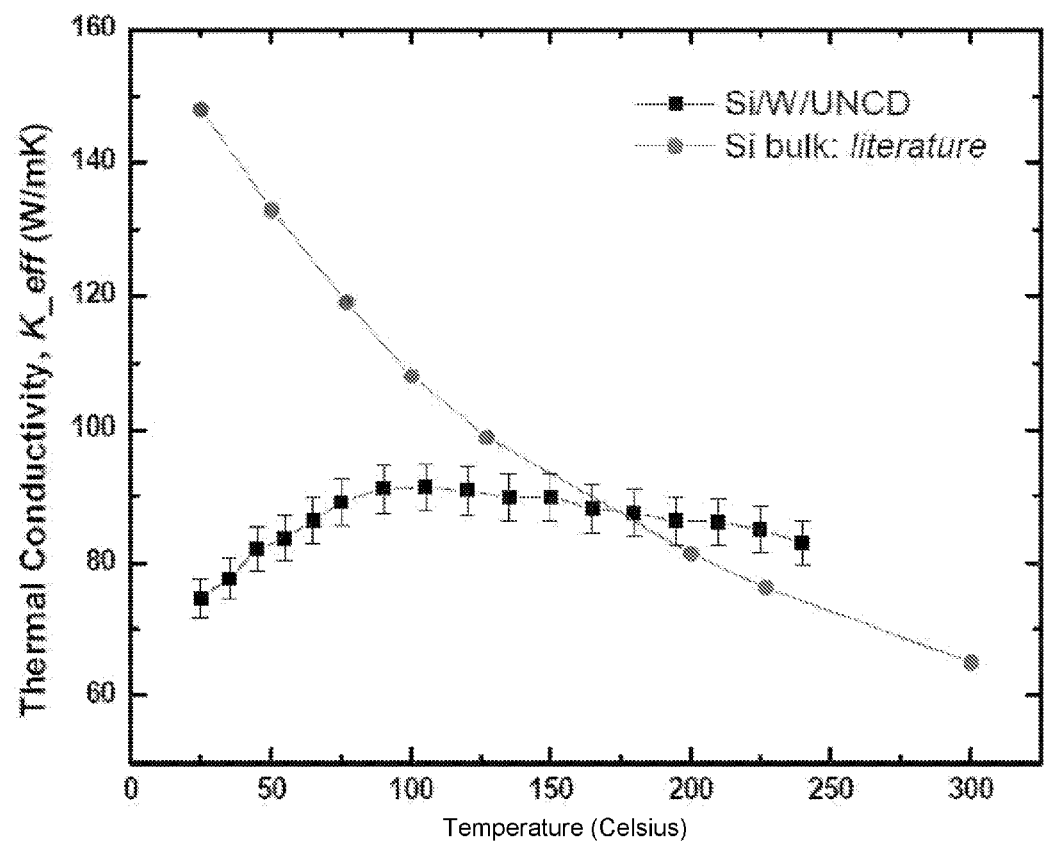
FIG. 12 illustrates thermal conductivity as a function of temperature for an UNCD/Si substrate and reference bulk Si.

In the TPS method, an electrically insulated flat nickel sensor is placed between two pieces of the substrate. The sensor is working as the heater and thermometer simultaneously. A current pulse is passed through the sensor during the measurement to generate the heat wave. Thermal properties of the material are determined by recording temperature rise as a function of time using the equation, $\Delta T(\tau)=P(\pi^{3/2} rK)^{-1} D(\tau)$, where $\tau=(t_m \alpha/r^2)^{1/2}$, $\alpha$, is the thermal diffusivity, $t_m$ is the transient measurement time, r is the radius of the sensor, p is the input heating power, and $D(\tau)$ is the modified Bessel function. The time and the input power are chosen so that the heat flow is within the sample boundaries and the temperature rise of the sensor is not influenced by the outer boundaries of the sample. To make sure that our system is properly calibrated we measured thermal conductivity of standard Si wafers and compared the results with the literature values. One can see FIG. 11 that our measured data are in excellent agreement with the previously reported values. The temperature dependence of the thermal conductivity K~1/T is also in agreement with the theory for high-quality crystals. FIG. 12 presents the measured $K_{eff}(T)$ for a reference Si wafer and a UNCD/Si composite substrates. The Si wafer's K scales as ~1/T, which is expected for semiconductor crystals near and above room temperature. The effective thermal conductivity of the UNCD/Si becomes larger than that of Si at higher temperature due to improved inter-grain phonon transparency in UNCD.

Example III

Metal Induced Transformation of Diamond Into Single Domain Grapehene on Wafer Scale in Seconds The presently described example reports a new process of graphene synthesis, based on rapid thermal annealing of diamond film in the presence of metal catalyst, which outperforms all other existing methods of growing graphene without the transfer process and enables single domain growth of graphene. In this context, single domain graphene, or single crystal graphene, refers to a graphene with a continuous arrangement of hexagonally bonded carbons. Any non-hexagonal bonding, multilayer, or gaps would "break" the structure and define the boundary of the crystal.

Figure 15A:
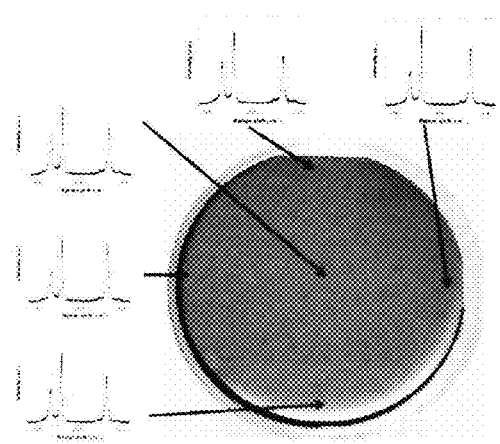
FIGS. 15A-B illustrates wafer scale grown graphene on UNCD.
Figure 15B:
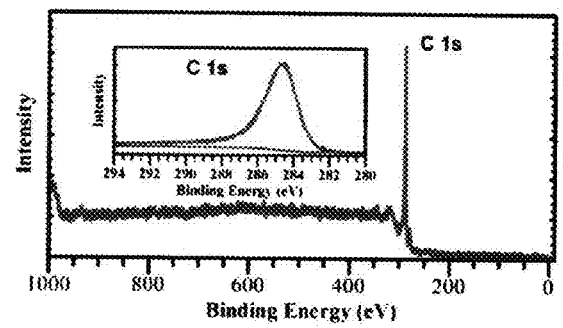

Because of the grain boundaries in the diamond film nickel segregates through the UNCD during rapid thermal annealing process. This fact benefits in graphene growth directly on the diamond surface, allowing to produce the wafer scale diamond films covered with graphene. The quality of the produced graphene films was checked with Raman analysis at different points of the wafer as well as with XPS analysis demonstrating the clear carbon signature without any presence of nickel on the surface after the annealing process (FIG. 15), thus confirming complete nickel segregation inside the UNCD layer. Also, detailed analysis of carbon peak demonstrates presence of only $sp^2$ bonded carbon on the surface, thus indicating high purity, without any modification (such as oxidation), nature of graphene.

Figure 16A:
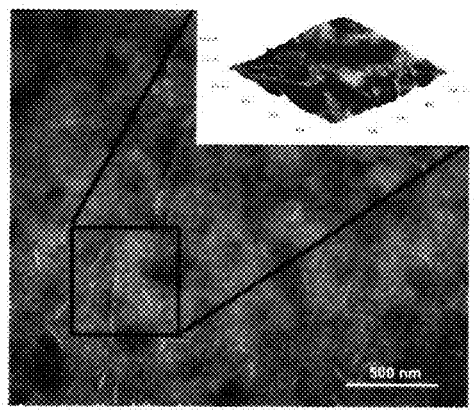
FIGS. 16A-B illustrates in FIG. 16A SEM and AFM images of grown graphene indicate the formation of the continuous uniform film with occasional folds occurring.

More detailed surface analysis of the produced wafer indicates growth of continuous graphene film. FIG. 16A demonstrates the quality of the as-grown film, indicating smooth surface structure with occasional folds of graphene layer occurring. Some of the folds seen on the atomic force microscopy (AFM) image are responsible for the defect peak in Raman signature. The presence of the folds is assumed to be due to UNCD roughness and the annealing speed.

Figure 16B:
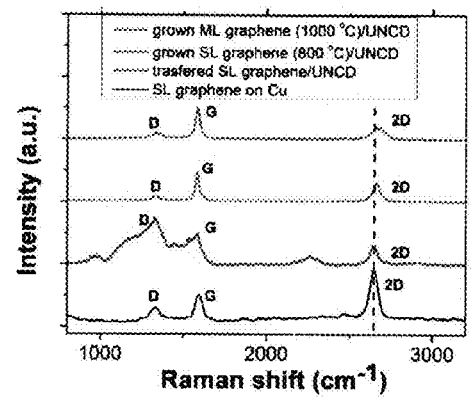

To be able to vary the thickness of the grown graphene film the temperature of the process was varied from 800° C. up to 1000° C. (FIG. 16B). Due to substrate effect of underlying diamond film the graphene Raman signature shows presence of defect peak D (at ~1335 cm$^{-1}$) and low intensity ratio 2D (at ~2650 cm$^{-1}$) to G (at ~1585 cm$^{-1}$) bands in comparison to that of single layer graphene (2:1), grown on copper foil (FIG. 16B). Moreover, significant blueshifts of G and 2D bands as well as increase 2D-band full width half maximum (fwhm) for graphene on diamond are seen. This effect occurs due to interfacial covalently bonded to UNCD carbon layer with graphene like lattice, which changes the lattice constant and electronic properties of top graphene layer. Similar effect was seen before for graphene grown on SiC substrate. In case of low 800° C. annealing temperature the number of graphene layers is significantly reduced, though as-grown graphene contains more folds, while in case of annealing temperature increase the thicker graphene film with smoother structure is observed. Therefore, the thickness of grown graphene can be tuned by varying temperature and time of annealing. The quality of the grown graphene on UNCD film was also evaluated by measuring the sheet resistance of the grown film using the four point probe method. The sheet resistance of received graphene/UNCD films varies from 0.09 ohm/square for thick graphene sample grown at 1000° C. up to 3.1 ohm/square for single layer graphene grown at 800° C.

In addition to growing high quality planar sheets of graphene directly on the UNCD surface, free standing graphene films were grown over the holes made in diamond (FIG. 17). FIG. 17A demonstrates that annealing of the Ni/UNCD sample resulted in 3 holes being completely covered with graphene with 1 hole remaining partially covered with graphene.

To determine the quality of the grown graphene it was transferred to the transmission electron microscopy (TEM) grid and the selected area electron diffraction (SAED) pattern was identified to demonstrate the single crystal growth (FIGS. 17D and 17E).

Detailed Raman study of the graphene on the hole indicates lowering the intensity of defect peak and increasing the intensity of 2D peak, though the signature does not correspond yet to the single layer graphene due to shallow shape and small size of the hole (FIG. 18).

Figures 19E, 19F:
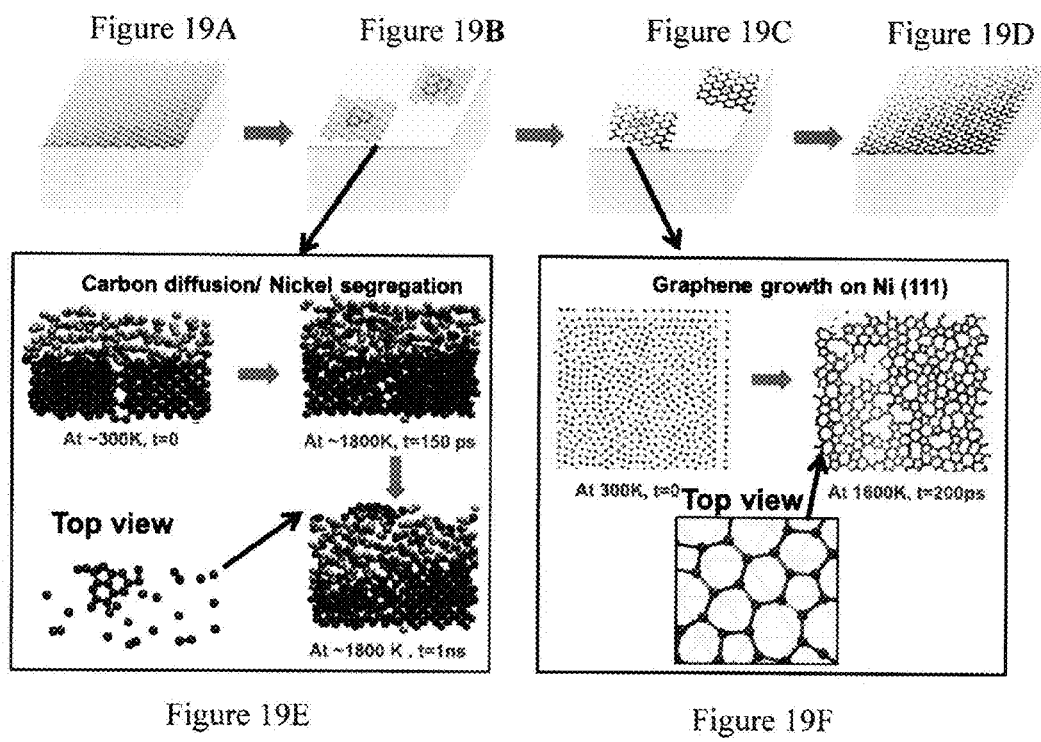

To explore the possible mechanism of the direct graphene/diamond growth, two types of molecular dynamic (MD) simulations were performed. FIG. 19 demonstrates the schematic of the graphene growth procedure on diamond substrate. Based on the received experimental and theoretical results, it is believed that the new mechanism of graphene nucleation and growth through Ni induced transformation of diamond into the graphene is two-fold: 1) Carbon diffusion through the nickel film with eventual segregation of nickel down through the diamond grain boundaries (FIG. 19E); 2) nucleation of graphene islands on Ni (111) with lateral growth of graphene film until full coverage is achieved (FIG. 19F).

When the system is heated to elevated temperatures, nickel atoms start to segregate down through the diamond grain boundaries while carbon atoms separate from the diamond lattices by forming amorphous carbon on top of nickel (111) film. As it was demonstrated by Hofmann et al. surface diffusion of carbon has low barrier on the Ni (111) surface, with results in fast rate of following graphene formation. Meanwhile, Ni (111) plays the role of a template to facilitate nucleation of hexagonal structure from amorphous carbon layer, and when graphene layers eventually meet they form mostly uniform and defect-free coverage. Preferential Ni (111) crystal plane of the sputtered nickel films was confirmed experimentally by x-ray diffraction (XRD) analysis.

The described procedure of growing high quality wafer-scale graphene film directly on insulating substrate via rapid thermal annealing of diamond film in the presence of metal catalyst, outperforms all other existing methods of growing graphene without the transfer process. Tuning of graphene thickness is achieved through the annealing temperature variation, indicating, that at lower 800° C. temperature the received graphene film consists only from few layers, while increase in temperature up to 1000° C. results in multi-layer graphene. The molecular dynamic (MD) simulation results indicate new mechanism of graphene nucleation and growth through Ni induced amorphization of diamond. The novel scheme of fabricating suspended graphene membranes directly on diamond offers unique opportunity to take full advantages of intrinsic properties of graphene, for the first time. Thus, the graphene-on-diamond platform is promising for the development of high performance, energy efficient nanoelectronic devices.

Methods

50nm of Nickel have been deposited on the ultra nanocrystalline diamond (UNCD) surface by e-beam sputtering deposition. After this, the samples were processed in a rapid thermal annealing system under 800-1000° C. temperature for 60 seconds while flowing 500 sccm of the forming gas mixture (5% of $H_2$ and 95% of $N_2$). This procedure resulted in growing the uniform layer of graphene directly on the UNCD surface.

Fabrication Procedure

Ultrananocrystalline diamond (UNCD) film is grown by a microwave plasma-enhanced CVD (MPCVD) process using an Ar-rich/$CH_4$ chemistry (Ar (99%)/$CH_4$ (1%)) on silicon substrate. The thickness of UNCD films varied from 200 nm up to 300 nm.

Figure 20:
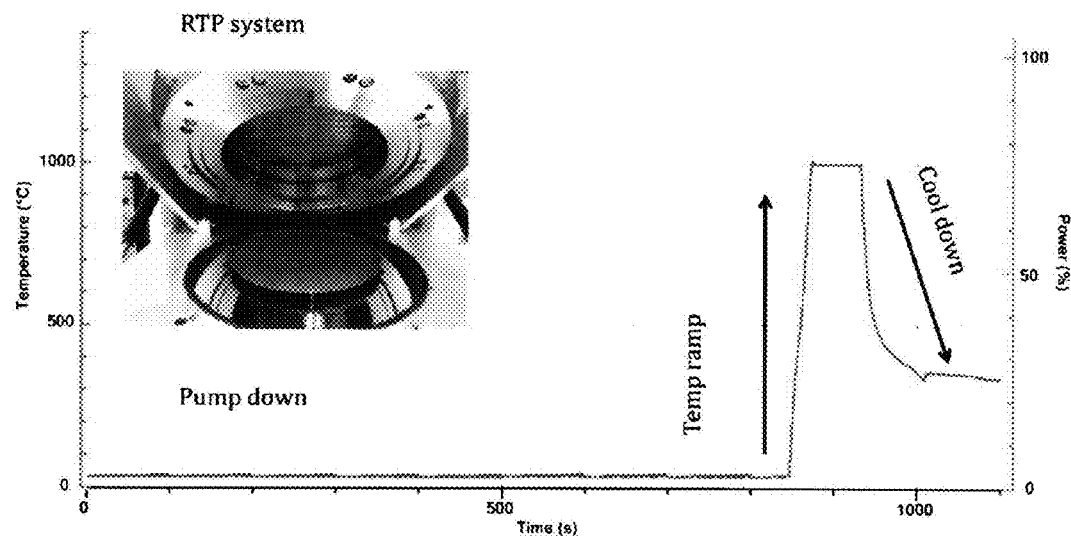
FIG. 20 rapid thermal annealing process
Figures 21A, 21B:
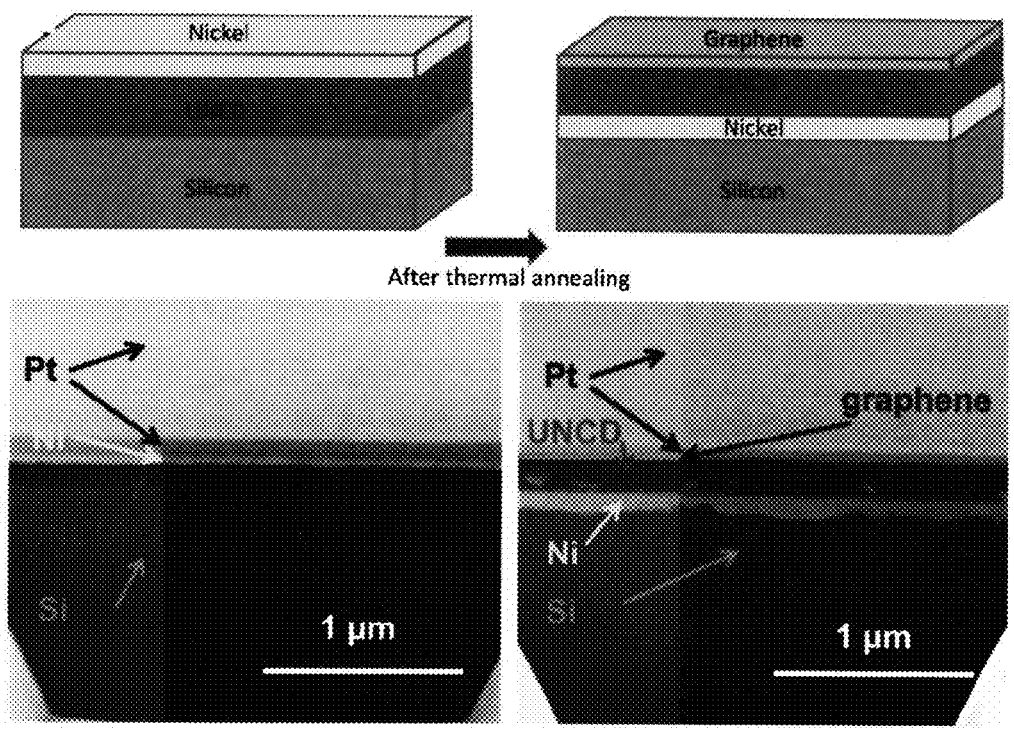
FIGS. 21A-B shows a schematic of rapid thermal annealing process.

50 nm of Nickel have been deposited on the UNCD surface by e-beam sputtering deposition. After this, the samples were processed in a rapid thermal annealing system under 800-1000° C. temperature for 60 seconds while flowing 500 sccm of the forming gas mixture (5% of $H_2$ and 95% of $N_2$). The typical recipe for the annealing process at 1000° C. is demonstrated at FIG. 20. This procedure was showing to be effective for growing the uniform graphene layers on the UNCD surface. FIG. 21 shows the schematic of deposited layers before and after the annealing process as well as the cross-section images of the films.

Single-Layer Graphene Characterization

Figure 22:
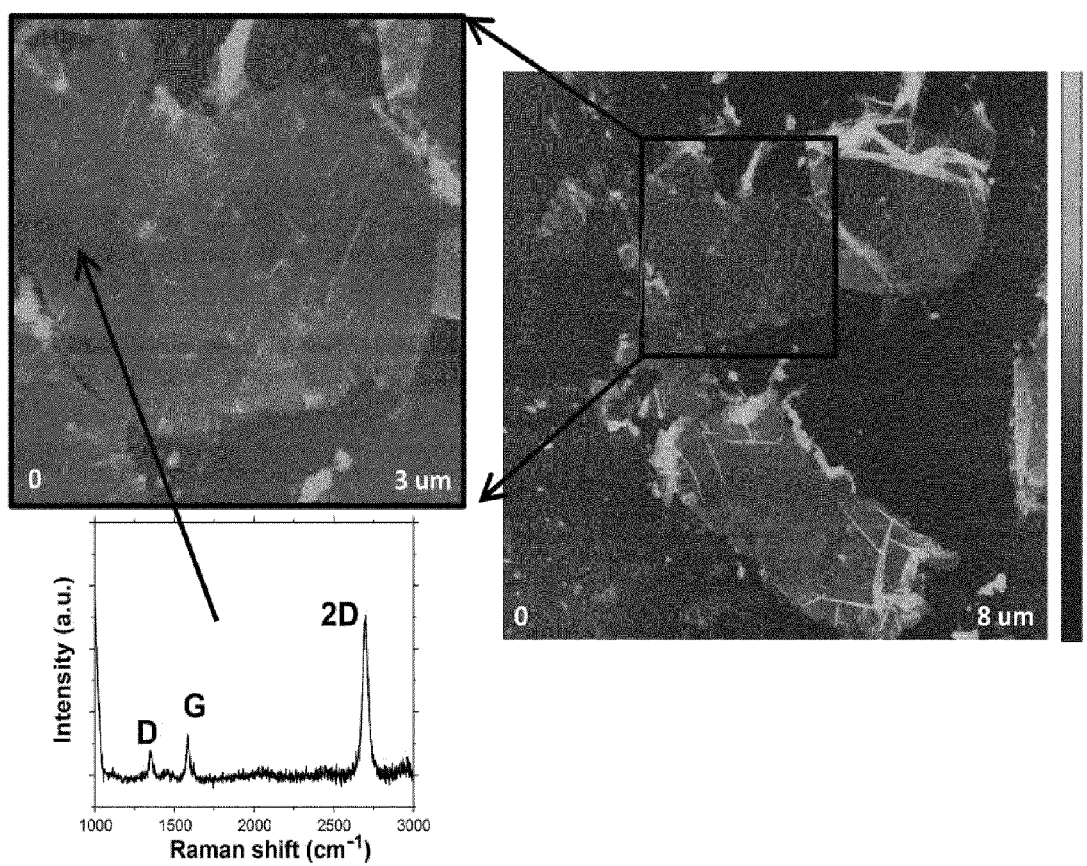
FIG. 22 shows an AFM image of the single layer graphene transferred on $SiO_2$ substrate. Raman signature indicates single layer graphene with height profile confirming the flake thickness of ~0.6 nm.

To evaluate the quality and thickness of the grown at 800° C. graphene layer, it was transferred onto silicon dioxide ($SiO_2$) substrate using thermal release tape procedure. Due to the strong adhesion to the underlying diamond substrate, it was possible to receive the transferred graphene in form of flakes. FIG. 22 presents AFM image of the received single layer graphene flakes.

Free-Standing Graphene

Figures 23A, 23B, 23C:
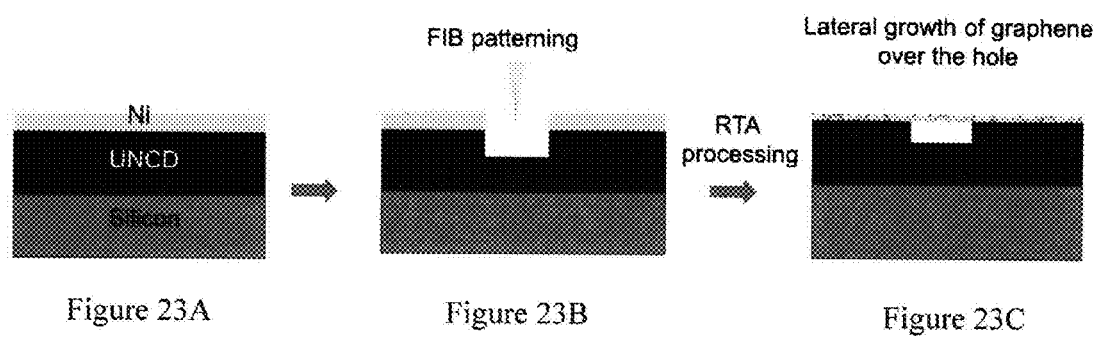
FIGS. 23A-C show SEM images of the free-standing graphene growth procedure.
Figure 24A:
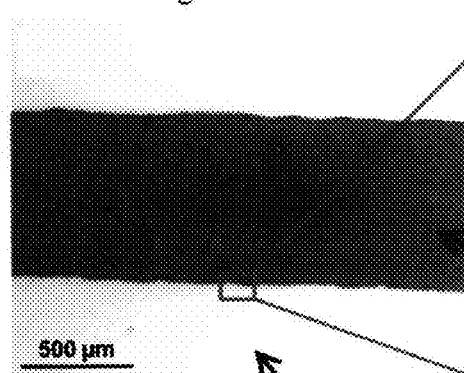
FIGS. 24A-D show selective growth of graphene on diamond through nickel patterning.
Figure 24B:
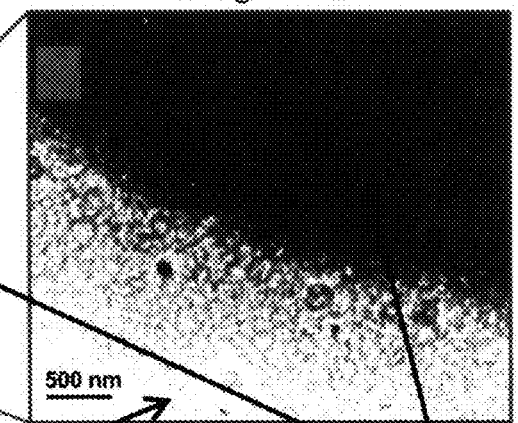
Figure 24C:
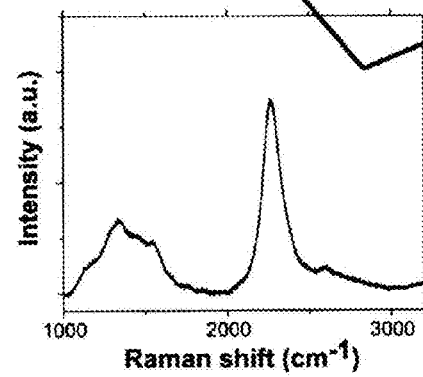
Figure 24D:
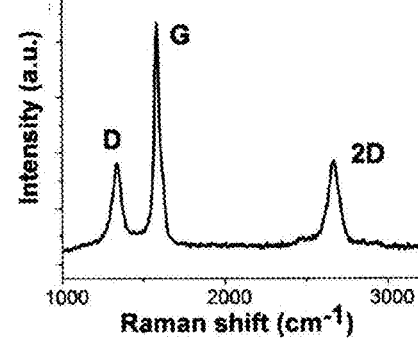

For free-standing graphene growth process the procedure was as following: 1) 500 nm deep holes of diameter varying from 300 nm up to 1 μm are made in 50 nmNi/UNCD film using SEM ion beam milling; 2) RTP annealing steps are performed following the same procedure as mentioned above for the plain UNCD sample (FIG. 23).

Nickel Patterning for Selective Graphene Growth

Patterning of the nickel layer was performed by depositing 50 nm of nickel through a shadow mask. After RTP processing, the resulting film demonstrated selective growth of graphene on diamond at the places where nickel film was deposited (FIG. 24).

Characterization

X-ray photoemission spectroscopy (XPS) analysis was performed by a home-built X-ray photoelectron spectrometer, which includes a hemispherical electron energy analyzer of 0.9eV energy resolution and a non-monochromated Mg K-alpha soft x-ray source source at 1253 eV.

Raman spectroscopy analysis has been performed by an Invia Confocal Raman Microscope using the red laser light (λ=633 nm) to confirm the formation of a graphene layer on the UNCD surface. Intensity and position of the characteristic G and 2D graphene peaks, as well as the full width at half maximum (fwhm) of 2D peak in the Raman spectra show variation in the number of graphene layers grown at different temperature. The presence of defect peak D can be explained by graphene folds clearly seen in SEM and AFM images. Also the roughness of the underlying UNCD grains affects the overall quality of the grown graphene.

Scanning Electron Microscopy (SEM) images were received using FEI Nova 600 Nanolab dual-beam microscope with focused ion beam (FIB) used for making the cross-section of the grown layers. Deposition of two platinum films on the surface before making the cross-section is performed to protect the sample. Energy-dispersive X-ray spectroscopy (EDS) analysis of the layers confirmed the position of nickel layer (as shown on the figure) before and after annealing, and carbon layer, confirming nickel segregation inside the UNCD and thus producing direct graphene deposition on the diamond surface.

Atomic force microscopy (AFM) measurements were performed to demonstrate 3D structure of the grown layers. For this purpose, the images were acquired by an AFM Veeco Microscope in ambient air conditions (RH~40%) using a n-doped silicon tip in tapping mode.

Transmission electron microscopy (TEM) studies were performed on two different types of samples: grown graphene layer and the cross section of graphene grown on UNCD. In the first case, the sample was prepared by using thermal release tape to transfer the top layer on the TEM 300 mesh copper grid. In the second case, the sample was prepared using focused ion beam at the SEM instrument, when the sample was cut at the cross section and then attached to the TEM lift-out grid using FIB milling. Observation of the single crystal graphene is performed using transmission electron microscope (TEM) JEOL JEM-2100F.

X-ray Diffraction (XRD) analysis was performed with Bruker D2 Phaser Diffractometer to demonstrate the crystal orientation of the grown Nickel films on UNCD wafer.

Molecular Dynamic Simulations

Figure 25:
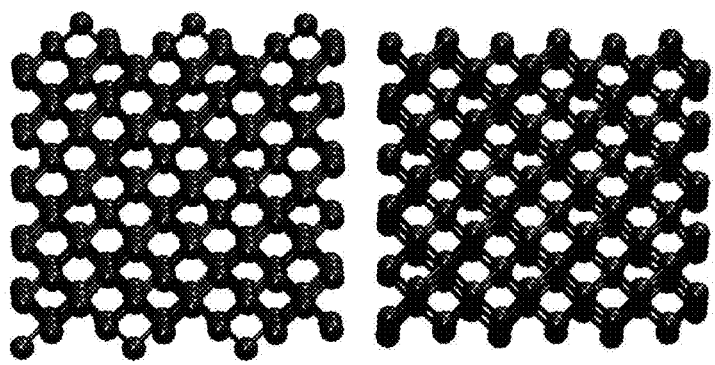
FIG. 25 shows initial configuration showing a typical grain boundary (Σ13 twist (100)) in a ultra-nano-crystalline diamond (UNCD).

Generation of diamond grain boundary: Reactive molecular dynamics (MD) simulations with dynamic charge transfer between atoms is used to investigate the nucleation and growth kinetics as well as the early stages of nanoscale graphene growth in a system comprising of Ni(100) surface placed on top of a diamond grain-boundary. The simulations of a typical grain boundary in a ultrananocrystalline diamond (UNCD) were done on the Σ13 twist (100) grain boundary (GB). It was reported previously that this particular grain boundary presents a good compromise between the computational requirements and the need of a reasonably large cell size needed to reproduce a general high-angle GB. The procedure for the generation of the grain boundary is as follows: As a first step, a relative rotation is performed of the two halves of the crystal by 67.4° about the z axis that is normal to the common (100) plane. Such a rotation gives a coincident site lattice periodic in two dimensions with a planar cell containing 13 atoms per (100) plane. A three-dimensional periodic model of the crystal was constructed with planar repeating grain boundaries. Note that the periodicity in the third dimension is achieved by extending the two grain boundaries per repeating cell. Each cell has a thickness of 16 layers and thus contains 208 carbon atoms. This generated grain boundary was subjected to a relaxation or an equilibration procedure. During the initial relaxation, the dimensions of the cell in the GB plane were fixed because of the rigidity of the diamond lattice. However, the simulations do allow for expansion in the z direction to reproduce the volume increase in the grain boundary region. Subsequently, thermal equilibration of this initial structure was performed by simulating at a high temperature of 1500 K for 100 ps. Simulated annealing was used to gradually lower the temperature, and the final structure was optimized by a conjugate gradient method. The initial equilibrated grain boundary structure is shown in FIG. 25.

Potential Model for Reactive Simulations: To simulate the growth of graphene on diamond surfaces and grain boundary, molecular dynamic (MD) simulations were utilized employing a reactive force-field (ReaxFF) potential model that allows for variable and dynamic charge transfer between atoms. In particular, reactive force-field (ReaxFF) implements the feature of quantum chemistry calculations, including molecular association/dissociation and charge transfer between cations and anions, and therefore ensure a more accurate description of the oxidation simulation. By calculating many-body interactions of a single particle, characteristics of quantum chemistry effect are employed in multiple-components of particle interactions as shown in Eq. (4), such as bond energy, over/under coordination, lone-pair energy, valence angle, torsion, hydrogen bond, van der Waals, and Coulomb.

$$E_{total} = E_{bond} + E_{over} + E_{under} + E_{lp} + E_{val} + E_{tors} + E_H + E_{vdw} + E_{Coul} \quad (4)$$

Additionally, the temporal charges of cations/anions are calculated using the electronegativity equalization method as shown in Eq. (5).

$$E(q) = \sum_i \left[ \chi_i q_i + \eta_i q_i^2 + \text{Tap}(r_{ij}) k_c \frac{q_i q_j}{(r_{ij}^2 + \gamma_{ij}^{-3})^{1/3}} \right] \quad (5)$$

In the above equation, q, χ, η, Tap(r), γ, and $k_C$ are ion charge, electronegativity, atomic hardness, 7th order taper function, shielding parameter, and dielectric constant, respectively. Detailed implementation and development of ReaxFF models for Ni—C interactions can be found in the work by Adri et al. It is capable of treating both metallic and ceramic systems as well as bond formation and bond breakage involved in the graphene nucleation and growth processes. Additionally, it can take into account the presence of multiple coordination as well as valence states in the growing graphene film. The simulation set-up (FIG. 25) and computational details are summarized below.

Figure 26:
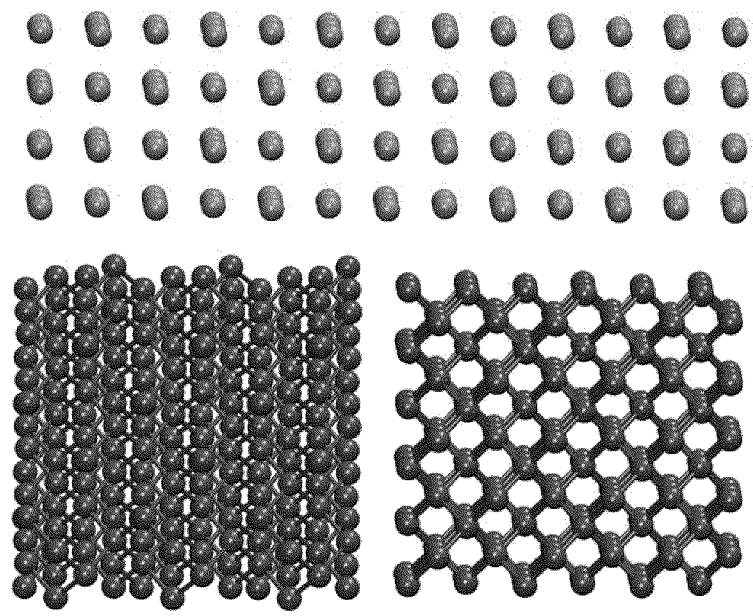
FIG. 26 Initial configuration showing the Ni(100) slab on top of the UNCD grain boundary.
Figure 27:
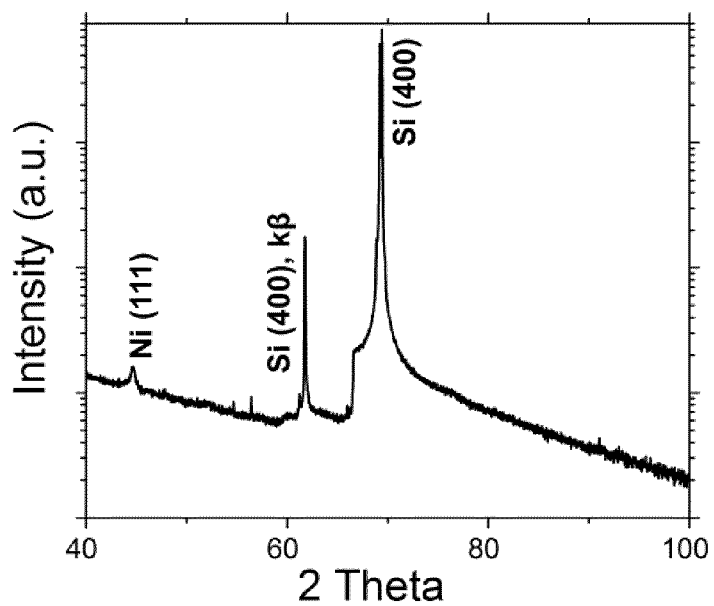
FIG. 27 XRD analysis of 50 nm Ni film on UNCD wafer. The size of nickel crystals is estimated from full width half maximum (fwhm) of Ni(111) peak (at 2θ=44.1) using Scherrer equation as 15 nm.
Figure 30A:
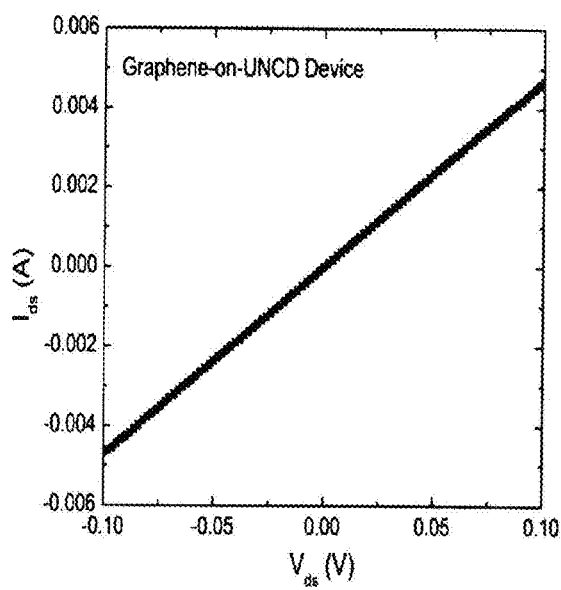
FIG. 30A Two terminal current-voltage characteristics Ids vs Vds at zero gate bias.
Figure 30B:
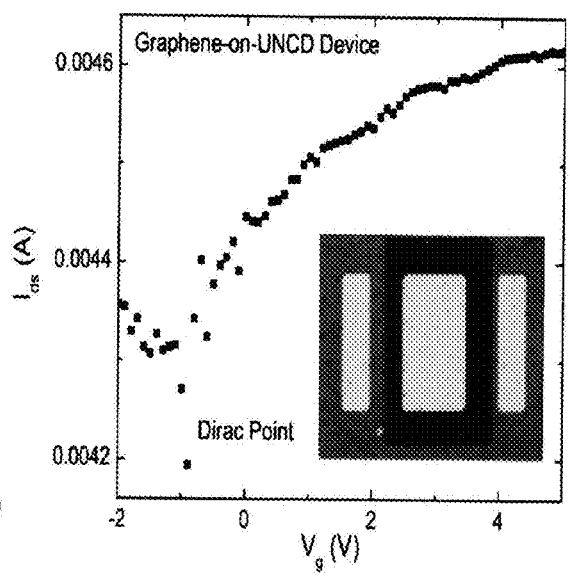
FIG. 30B Three terminal measurement source-drain current versus top-gate bias. Drain voltage is fixed at 0.1V.

Simulation details: The dynamical evolution of graphene formation involves several steps which includes diffusion of Ni atoms through the diamond grain boundary, reactive amorphization of the adjacent carbon atoms and Ni catalyzed graphitization. These events are captured using the ReaxFF potential model. A schematic showing the actual simulation set-up is shown in FIG. 26. The simulation cell comprised of Ni thin film placed on top of the Σ13 twist (100) GB. Prior to the actual simulations of graphene nucleation and growth, the system comprising of Ni on top of grain boundary are subjected to an equilibration procedure at 300 K. About 100000 MD steps using isokinetic MD was performed. The temperature was maintained constant at using a Nose-Hoover thermostat. Both the Ni thin film and the diamond surfaces forming the grain boundary are allowed to freely relax during these equilibration runs with no charge transfer. The equilibrated samples are then simulated in a NVT ensemble for 1 ps with dynamic charge transfer using the ReaxFF potential model to generate the final 300 K relaxed configuration.

The slab of Ni (100) is then placed on top of the diamond surfaces; the grain boundary is normal to the Ni(100) surface (FIG. 26). The simulations of Ni-induced amorphization of carbon and subsequent graphization are all carried out at high temperature of ~1200 K. To facilitate comparisons with the experiments, the graphene growth simulations were performed in both hydrogen and hydrogen-free environments. The hydrogen atmosphere was created by introducing $H_2$ molecules in the simulation box with their x, y, and z positions chosen randomly. In the case of simulations in the hydrogen environment, reflecting boundary conditions are imposed in the z-direction to confine the molecules that might reach the simulation box limit. The gas pressure is thus maintained constant during these simulations.

In all the simulations, the atomic velocities are chosen from a Maxwell-Boltzmann distribution corresponding to the required temperature. The equations of motion are integrated using a leapfrog scheme with time steps of 1fs. The charge relaxation procedure used to minimize the electrostatic energy subject to the electro-neutrality principle is very time consuming. Hence, the atomic charges were updated every $10^{th}$ MD step. The influence of a more frequent charge update was found to have no influence on the observed simulation results. The simulations were carried out using the Large-scale Atomic/Molecular Massively Parallel Simulator (LAMPPS).

Nickel Film Properties

XRD analysis of grown 50 nm Ni films was performed to explore the importance of crystal orientation for the uniformity of graphene layers. FIG. 22 demonstrates that nickel films used for successful graphene growth have preferential orientation of Ni (111).

To understand the impact of the surface orientation of underlying Ni substrate on graphene growth, molecular dynamics (MD) simulations were performed of annealing amorphous carbon deposited on Ni substrates with surface normal oriented along the crystallographic 111 and 001 planes. The interactions between Ni and C atoms were modeled by a reactive force field (ReaxFF) with parameters obtained from Mueller, J. E., van Duin, A. C. T. & Goddard, W. A. Development and Validation of ReaxFF Reactive Force Field for Hydrocarbon Chemistry Catalyzed by Nickel. *The Journal of Physical Chemistry C* 114, 4939-4949, doi:10.1021/jp9035056 (2010). For each of these simulations, an initial configuration (t=0) was generated by placing a layer of completely disordered (amorphous) carbon (with nearest C-C spacing ~2-2.5 Å) on Ni substrate ~40 Å×40 Å×50 Å with desired surface orientation, as shown in FIGS. 22a and 22e. Periodic boundary conditions were implemented in the plane of the surface. The temperature of the system was ramped from 300 K to 1600 K over 50 ps in a canonical ensemble (NVT) with Nose-Hoover thermostat, as implemented in LAMMPS; subsequently, the temperature was held at 1600 K for an additional 150 ps.

Direct visualization of the MD trajectories showed that in the initial ~5 ps, when the temperature is ~300 K, the density of amorphous carbon tends to increase, along with ordering of C atoms and formation of C-C bonds (FIGS. 28B and 28F). As indicated by FIGS. 28B and 28F, the nucleation of graphene islands i.e., with 6-membered carbon rings occurs on all Ni surfaces; however, the Ni (111) exhibits much higher nucleation of graphene like C-rings as compared to Ni(001) surface. To provide a quantitative assessment of this orientation preference, the rate of formation of C-rings containing 5--8 C members on Ni substrates of different orientations in the initial ~5 ps was calculated. From these calculations, among the low-index surfaces of Ni, it was found that the C rings form at the highest rate on Ni (111) ~30 rings /ps; this rate is more than twice as fast as that on Ni (001) surface (~12 rings/ps). Interestingly, most of the rings (~65%) that form on Ni (111) surface are 6-membered (like the hexagons in graphene), while the population of 6-membered rings nucleated on Ni (001) surface is fairly limited, which is ~25% of the total nucleated C-rings [FIG. 28F]. This clearly indicates that graphene formation is most favorable on Ni (111) among the low-index planes.

After this initial time period, the C atoms continue to re-arrange to reduce the number of defects (i.e., off 6-membered rings, holes) but no new C-rings nucleate. As shown in FIG. 28C, the monolayer graphene that forms on Ni (111) surface features the least number of defects, and covers nearly the entire substrate. On the other hand, on Ni (001), graphene forms as patches and is highly defective [FIG. 28G]. The results were observed to be robust; the effect of Ni surface orientation on graphene growth is unaffected by the temperature schedule and the highest temperature achieved during the annealing. The kinetics of re-organization of C-atoms to reduce the defects, as expected, is slow at lower temperatures.

Upon close inspection of the atomic structure of Ni surfaces along different orientations, one plausible explanation for preferential nucleation of 6-membered C rings on Ni (111) as opposed to Ni (001) surfaces. The Ni atoms on (111) plane are arranged on a close-packed triangular lattice (FIG. 28D), which closely resembles the honeycomb structure of graphene; this enables Ni (111) substrate to provide a suitable template for the formation of nuclei for graphene growth, i.e., 6-membered C-rings. Ni (001) plane, on the other hand, exhibit rectangular lattice (FIG. 28H) and cannot provide such a template. Furthermore, recent first-principle calculations have reported that the diffusion of C on Ni (111) surface is much lower than that on Ni (001) (~0.5 eV on Ni (111); ~1.9 eV on Ni (001)). This leads to substantially higher diffusion of C on Ni (111) plane, which explains the faster rate of graphene growth on Ni (111).

Graphene on Diamond Based Transistors.

In order to test the electron mobility of the CVD grown graphene on UNCD substrate a number of graphene top-gate field-effect transistors (TG-FETs) was fabricated. The top-gate dielectric layer which consists of 20-nm-thick $HfO_2$ was grown by the atomic layer deposition (ALD). The electron beam lithography (EBL) technique was used to define the source, drain and gate electrodes. The films of Ti/Au with the thickness of 10-nm/100-nm were deposited by the electron beam deposition to form the metal contact to the devices. FIG. 29 shows an optical microscope image of a typical fabricated device. The scale bar is 100 μm. The dark part is a dielectric layer of $HfO_2$ with the size of 200 μm by 300 μm. The gate electrode is 200 μm in width and 120 μm in length. The source and drain electrodes are 200 μm in width and 50 μm in length.

The current-voltage (I-V) characteristics of the top-gated devices were measured using a semiconductor parameter analyzer (see FIG. 29). First, the source-drain current versus source-drain voltage was measured at zero gate bias via two terminal measurements. The linearity of $I_{ds}$ vs $V_{ds}$ curve confirms the high-quality Ohmic contact. FIG. 29b presents source-drain current as a function of the gate bias. The source-drain voltage was kept at 0.1 V during this measurement while the gate bias swept from −2 V to 5 V. The V-shape $I_{ds}$-$V_{gs}$ curve is characteristic for graphene and indicates that the charge carrier type can be switched from electrons to holes by tuning the gate bias. The Dirac point of the tested device is around −1 V. The carrier mobility of electrons and holes can be extracted using the Drude formula (Eq. 6):

$$\mu_{FE} = \frac{g_m}{C_g V_{ds}} \frac{L_g}{W} \tag{6}$$

where $$g_m = \frac{dI_{ds}}{dV_g}$$

is the transconductance, $$C_g = \frac{\varepsilon_r \varepsilon_0}{d}$$

is the gate capacitance per area and relative permittivity of HfO$_2$ is 25. L$_g$ and W are the length and width of the gate, respectively. The highest electron mobility extracted for the tested device was around 2000 cm$^2$/Vs.

The foregoing description of embodiments of the present invention has been presented for purposes of illustration and description. It is not intended to be exhaustive or to limit the present invention to the precise form disclosed, and modifications and variations are possible in light of the above teachings or may be acquired from practice of the present invention. The embodiments were chosen and described in order to explain the principles of the present invention and its practical application to enable one skilled in the art to utilize the present invention in various embodiments, and with various modifications, as are suited to the particular use contemplated.

The invention claimed is:

1. A method of forming single domain graphene on a substrate, comprising the steps of,
    providing a diamond substrate;
    forming a transition metal layer on the diamond substrate;
    forming at least one hole in the transition metal layer and diamond substrate;
    dissolving the transition metal layer into the diamond substrate by an annealing step; and
    cooling the substrate;
    forming single domain graphene suspended over the at least one hole.

2. The method of claim 1, wherein the at least one hole is a plurality of holes of diameter varying from 300 nm up to 1 μm.

3. The method as defined in claim 1 wherein the transition metal layer comprises Ni.

4. The method as defined in claim 1 wherein the annealing step includes placing the diamond substrate in a rapid thermal vacuum furnace with a H$_2$/Ar gas mixture and wherein an annealing temperature is about 800-1000° C. and the cooling step is performed at a rate of about 600 C./minute.

5. The method as defined in claim 1 wherein a thickness of the transition metal layer is established such that upon completing the dissolving step the transition metal from the transition metal layer has no trace amount in sub-surface regions of the carbon precursor.

6. A method of forming graphene on a substrate, comprising the steps of,
    providing a diamond substrate;
    forming a transition metal layer on the diamond substrate;
    dissolving the transition metal layer into the diamond substrate by an annealing step having an annealing temperature is about 800-1000° C.; and
    cooling the substrate, thereby forming a graphene layer from the diamond substrate as a carbon precursor, the cooling performed at a rate of about 600 C./minute; wherein a thickness of the transition metal layer is established such that upon completing the dissolving step the transition metal from the transition metal layer has no trace amount in sub-surface regions of the carbon precursor.

7. The method as defined in claim 6 wherein the diamond substrate is selected from the group of (a) single crystal diamond and (b) at least one of: UNCD/NCD/MCD (microcrystalline diamond) thin film diamond deposited on a Si substrate.

8. The method as defined in claim 6 wherein the transition metal layer comprises Ni.

9. The method as defined in claim 6 wherein the annealing step includes placing the diamond substrate in a vacuum furnace with a H$_2$/Ar gas mixture.

10. The method of claim 6, wherein the substrate is heated to the annealing temperature in about 30 s for annealing.

* * * * *